US012635373B2

(12) United States Patent
Jeon et al.

(10) Patent No.: US 12,635,373 B2
(45) Date of Patent: May 19, 2026

(54) ORGANIC LIGHT EMITTING DIODE AND ORGANIC LIGHT EMITTING DEVICE INCLUDING THEREOF

(71) Applicant: LG Display Co., Ltd., Seoul (KR)

(72) Inventors: Seong-Su Jeon, Paju-si (KR); Shin-Han Kim, Paju-si (KR); Ji-Cheol Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 1183 days.

(21) Appl. No.: 17/369,773

(22) Filed: Jul. 7, 2021

(65) Prior Publication Data

US 2022/0158110 A1 May 19, 2022

(30) Foreign Application Priority Data

Nov. 17, 2020 (KR) ........................ 10-2020-0153583

(51) Int. Cl.
*H10K 59/32* (2023.01)
*H10K 50/11* (2023.01)
(Continued)

(52) U.S. Cl.
CPC ............. *H10K 59/32* (2023.02); *H10K 50/11* (2023.02); *H10K 50/131* (2023.02); *H10K 50/19* (2023.02); *H10K 59/38* (2023.02); *H10K 59/875* (2023.02); *H10K 85/60* (2023.02); *H10K 85/615* (2023.02); *H10K 85/624* (2023.02);
(Continued)

(58) Field of Classification Search
CPC ...... H10K 50/11; H10K 50/131; H10K 50/13; H10K 50/19; H10K 59/12; H10K 59/32; H10K 59/38; H10K 59/875; H10K 85/60; H10K 85/615; H10K 85/624; H10K 85/626; H10K 85/631; H10K 85/633; H10K 85/6572; H10K 2101/30; H10K 2101/40
See application file for complete search history.

(56) References Cited

U.S. PATENT DOCUMENTS 10,756,274 B2 8/2020 Kim et al.
2015/0155513 A1 6/2015 Pieh et al.
(Continued)

FOREIGN PATENT DOCUMENTS

CN 104681729 A 6/2015
KR 10-2008-0084979 A 9/2008
(Continued)

*Primary Examiner* — Elizabeth M. Dahlburg
(74) *Attorney, Agent, or Firm* — Seed Intellectual Property Law Group LLP

(57) ABSTRACT

The present disclosure relates to an organic light emitting diode and an organic light emitting device including thereof. The organic light emitting diode (OLED) includes multiple emitting parts disposed between two facing electrodes and at least one charge generation layer disposed between the multiple emitting parts. The at least one of the multiple emitting parts includes a green emitting material layer, and an energy bandgap between HOMO energy level of host and LUMO energy level of dopant in a P-type charge generation layer is controlled. The OLED and the organic light emitting device can improve their luminous efficiency by controlling charge injections in an emissive layer and improve efficiently white balance by suitable color compensation.

24 Claims, 14 Drawing Sheets

(51) Int. Cl.

| | |
|---|---|
| ***H10K 50/13*** | (2023.01) |
| ***H10K 50/19*** | (2023.01) |
| ***H10K 59/38*** | (2023.01) |
| *H10K 59/80* | (2023.01) |
| *H10K 85/60* | (2023.01) |
| *H10K 101/30* | (2023.01) |
| *H10K 101/40* | (2023.01) |

(52) U.S. Cl.
CPC ......... *H10K 85/626* (2023.02); *H10K 85/633* (2023.02); *H10K 85/6572* (2023.02); *H10K 2101/30* (2023.02); *H10K 2101/40* (2023.02)

(56) References Cited

U.S. PATENT DOCUMENTS

| | | | | |
|---|---|---|---|---|
| 2019/0305227 | A1* | 10/2019 | Yoon .................... | H10K 85/626 |
| 2021/0202857 | A1* | 7/2021 | Shin ..................... | H10K 85/615 |

FOREIGN PATENT DOCUMENTS

| | | | |
|---|---|---|---|
| KR | 20150064517 | A | 6/2015 |
| KR | 20170116301 | A | 10/2017 |
| KR | 20180009522 | A | 1/2018 |

* cited by examiner

ORGANIC LIGHT EMITTING DIODE AND ORGANIC LIGHT EMITTING DEVICE INCLUDING THEREOF

CROSS-REFERENCE TO RELATED APPLICATIONS

This application claims the priority benefit under 35 U.S.C. § 119(a) of Korean Patent Application No. 10-2020-0153583, filed in the Republic of Korea on Nov. 17, 2020, the entire contents of which are expressly incorporated herein by reference in its entirety into the present application.

BACKGROUND

Technical Field

The present disclosure relates to an organic light emitting diode, and more specifically, to an organic light emitting diode in which charges can be injected in balance and which implement efficient color compensation and an organic light emitting device including the diode.

Description of the Related Art

An organic light emitting diode (OLED) among a flat display device used widely has come into the spotlight as a display device replacing rapidly a liquid crystal display device (LCD). The OLED can be formed as a thin organic film less than 2000 Å and can implement unidirectional or bidirectional images by electrode configurations. Also, the OLED can be formed even on a flexible transparent substrate such as a plastic substrate so that a flexible or a foldable display device can be realized with ease using the OLED. In addition, the OLED can be driven at a lower voltage and the OLED has excellent high color purity compared to the LCD.

BRIEF SUMMARY

The inventors of the present disclosure have recognized and appreciated that in the related art, since fluorescent material uses only singlet exciton energy in the luminous process, fluorescent material shows low luminous efficiency. On the contrary, phosphorescent material can show high luminous efficiency since it uses triplet exciton energy as well as singlet exciton energy in the luminous process. However, the inventors have also recognized that the metal complex, representative phosphorescent material, has short luminous lifespan for commercial use. In addition, in case of implementing white emission using multiple luminous materials with different emission peaks in multiple emitting material layers, white balance among the luminism materials is destroyed. Accordingly, the inventors have identified the need to develop an organic light emitting diode that can improve its luminous efficiency as well as its luminous lifetime and can implement efficiently intended emission colors.

Accordingly, embodiments of the present disclosure are directed to an organic light emitting diode that substantially obviates one or more of the problems due to the limitations and disadvantages of the related art and an organic light emitting device including the diode. The embodiments of the present disclosure provides solution to the problems in the related art identified above as well as other technical problems in the related art.

One or more embodiments of the present disclosure provide an organic light emitting diode and an organic light emitting device that can implement color compensation efficiently to maintain white balance.

One or more embodiments of the present disclosure provide an organic light emitting diode and an organic light emitting device into which charges can be injected in balance.

Additional features and aspects will be set forth in the description that follows, and in part will be apparent from the description, or can be learned by practice of the inventive concepts provided herein. Other features and aspects of the inventive concept can be realized and attained by the structure particularly pointed out in the written description, or derivable therefrom, and the claims hereof as well as the appended drawings.

To achieve these and other aspects of the inventive concepts, as embodied and broadly described, in one aspect of the present disclosure provides an organic light emitting diode comprising: a first electrode; a second electrode facing the first electrode; multiple emitting parts between the first and second electrode; and at least one charge generation layer disposed between the multiple emitting parts, wherein the multiple emitting parts include at least one emitting part comprising a green emitting material layer, wherein the at least one charge generation layer includes a P-type charge generation layer providing holes into the green emitting material layer, wherein the P-type charge generation layer includes a P-type host and a P-type dopant, and wherein an energy bandgap between a Highest Occupied Molecular Orbital (HOMO) energy level of the P-type host and a Lowest Unoccupied Molecular Orbital (LUMO) energy level of the P-type dopant satisfies a relationship of the following Formula A:

$$0.35\ \text{eV} \le \text{LUMO}^D - \text{HOMO}^H \le 0.5\ \text{eV}; \qquad \text{Formula A:}$$

wherein $\text{LUMO}^D$ indicates the LUMO energy level of the P-type dopant and $\text{HOMO}^H$ indicates the HOMO energy level of the P-type host.

In another aspect, the present disclosure provides an organic light emitting diode comprising: a first electrode; a second electrode facing the first electrode; and an emissive layer disposed between the first and second electrodes, wherein the emissive layer includes a first emitting part disposed between the first and second electrodes, a second emitting part disposed between the first emitting part and the second electrode, a third emitting part disposed between the second emitting part and the second electrode, a first charge generation layer disposed between the first and second emitting parts, and a second charge generation layer disposed between the second and third emitting parts, wherein the second emitting part includes a green emitting material layer and a red emitting material layer, wherein the first charge generation layer includes a first P-type charge generation layer providing holes to the second emitting part and a first N-type charge generation layer providing electrons to the first emitting part, wherein the second charge generation layer includes a second P-type charge generation layer providing holes to the third emitting part and a second N-type charge generation layer providing electrons to the second emitting part, wherein the first P-type charge generation layer includes a first P-type host and a first P-type dopant, wherein the second P-type charge generation layer includes a second P-type host and a second P-type dopant, and wherein an energy bandgap between a Highest Occupied Molecular Orbital (HOMO) energy level of the first P-type host and a Lowest Unoccupied Molecular Orbital (LUMO) energy level of the first P-type dopant is different form an energy bandgap between a HOMO energy level of the second P-type host and a LUMO energy level of the second P-type dopant.

In still another aspect, the present disclosure provides an organic light emitting device including the organic light emitting diode over a substrate.

It is to be understood that both the foregoing general description and the following detailed description are explanatory and are intended to provide further explanation of the inventive concepts as claimed.

BRIEF DESCRIPTION OF THE SEVERAL VIEWS OF THE DRAWINGS

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION

Reference will now be made in detail to aspects of the disclosure, examples of which are illustrated in the accompanying drawings.

An energy bandgap between a host and a dopant in a charge generation layer providing charges into an emitting part can be controlled in an organic light emitting diode (OLED) having a tandem structure. Charges can be injected into the emitting part in balance so that charge generation and charge conductivity can be adjusted. Accordingly, the OLED can improve its luminous efficiency and reduce or minimize color changes caused by different gradation. The OLED can be applied into an organic light emitting device such as an organic light emitting display device or an organic light emitting illumination device.

Figure 1:
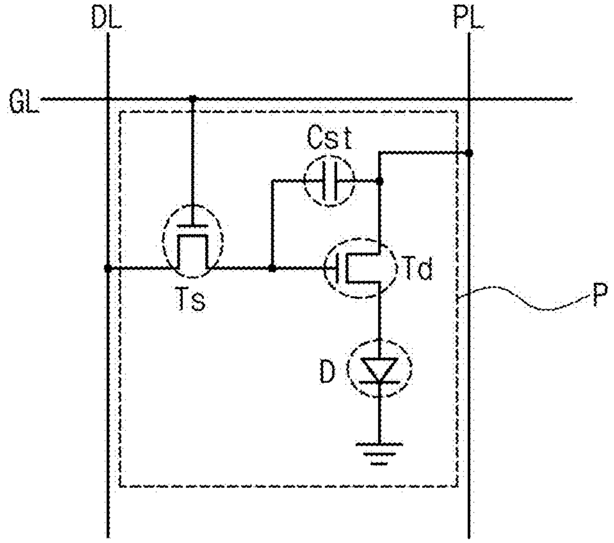
FIG. 1 is a schematic circuit diagram illustrating an organic light emitting display device in accordance with the present disclosure.

FIG. 1 is a schematic circuit diagram illustrating an organic light emitting display device of the present disclosure. As illustrated in FIG. 1, a gate line GL, a data line DL and power line PL, each of which cross each other to define a pixel region P, in the organic light display device. A switching thin film transistor Ts, a driving thin film transistor Td, a storage capacitor Cst and an organic light emitting diode D are formed within the pixel region P. The pixel region P may include a red (R) pixel region RP, a green (G) pixel region GP and a blue (B) pixel region BP.

The switching thin film transistor Ts is connected to the gate line GL and the data line DL, and the driving thin film transistor Td and the storage capacitor Cst are connected between the switching thin film transistor Ts and the power line PL. The organic light emitting diode D is connected to the driving thin film transistor Td. When the switching thin film transistor Ts is turned on by a gate signal applied into the gate line GL, a data signal applied into the data line DL is applied into a gate electrode of the driving thin film transistor Td and one electrode of the storage capacitor Cst through the switching thin film transistor Ts.

The driving thin film transistor Td is turned on by the data signal applied into the gate electrode so that a current proportional to the data signal is supplied from the power line PL to the organic light emitting diode D through the driving thin film transistor Td. And then, the organic light emitting diode D emits light having a luminance proportional to the current flowing through the driving thin film transistor Td. In this case, the storage capacitor Cst is charge with a voltage proportional to the data signal so that the voltage of the gate electrode in the driving thin film transistor Td is kept constant during one frame. Therefore, the organic light emitting display device can display a desired image.

Figure 2:
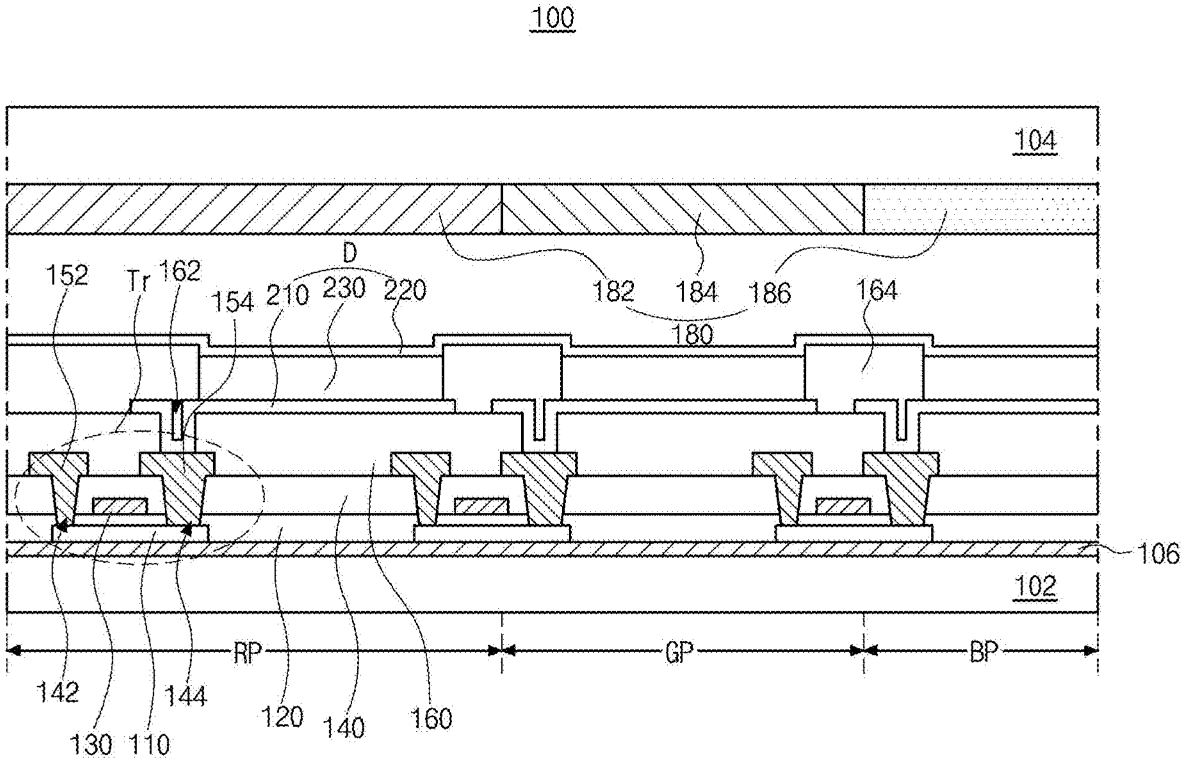
FIG. 2 is a cross-sectional view illustrating an organic light emitting display device as an example of an organic light emitting device in accordance with one aspect of the present disclosure.

FIG. 2 is a schematic cross-sectional view illustrating an organic light emitting display device in accordance with an aspect of the present disclosure. As illustrated in FIG. 2, the organic light emitting display device 100 comprises a first substrate 102, a second substrate 104 facing the first substrate 102, a thin-film transistor Tr over the first substrate 102, and an organic light emitting diode D disposed between the first and second substrates 102 and 104, connected to the thin film transistor Tr and emitting white (W) light and a color filter layer 180 disposed between the organic light emitting diode D and the second substrate 104.

As an example, the first substrate 102 defines a red pixel region RP, a green pixel region GP and a blue pixel region BP, and the organic light emitting diode D is located in each pixel region. In other words, the organic light emitting diode D, each of which emits white (W) light, is located correspondingly in the red pixel region RP, the green pixel region GP and the blue pixel region BP.

Each of the first substrate 102 and the second substrate 104 may include, but is not limited to, glass, thin flexible material and/or polymer plastics, respectively. For example, the flexible material may be selected from the group, but is not limited to, polyimide (PI), polyethersulfone (PES), polyethylenenaphthalate (PEN), polyethylene terephthalate (PET), polycarbonate (PC) and combination thereof. The first substrate 102, over which the thin film transistor Tr and the organic light emitting diode D are arranged, forms an array substrate.

A buffer layer 106 may be disposed over the first substrate 102, and the thin film transistor Tr is disposed over the buffer layer 106 correspondingly to each of the red pixel region RP, the green pixel region GP and the blue pixel region BP. The buffer layer 106 may be omitted.

A semiconductor layer 110 is disposed over the buffer layer 106. In one aspect, the semiconductor layer 110 may include, but is not limited to, oxide semiconductor materials. In this case, a light-shield pattern may be disposed under the semiconductor layer 110, and the light-shield pattern can prevent light from being incident toward the semiconductor layer 110, and thereby, preventing the semiconductor layer 110 from being deteriorated by the light. Alternatively, the semiconductor layer 110 may include polycrystalline silicon. In this case, opposite edges of the semiconductor layer 110 may be doped with impurities.

A gate insulating layer 120 including an insulating material is disposed on the semiconductor layer 110. The gate insulating layer 120 may include, but is not limited to, an inorganic insulating material such as silicon oxide ($SiO_x$) or silicon nitride ($SiN_x$).

A gate electrode 130 made of a conductive material such as a metal is disposed over the gate insulating layer 120 so as to correspond to a center of the semiconductor layer 110. While the gate insulating layer 120 is disposed over a whole area of the first substrate 102 in FIG. 2, the gate insulating layer 120 may be patterned identically as the gate electrode 130.

An interlayer insulating layer 140 including an insulating material is disposed on the gate electrode 130 with covering over an entire surface of the substrate 102. The interlayer insulating layer 140 may include an inorganic insulating material such as silicon oxide ($SiO_x$) or silicon nitride ($SiN_x$), or an organic insulating material such as benzocyclobutene or photo-acryl.

The interlayer insulating layer 140 has first and second semiconductor layer contact holes 142 and 144 that expose both sides of the semiconductor layer 110. The first and second semiconductor layer contact holes 142 and 144 are disposed over opposite sides of the gate electrode 130 with spacing apart from the gate electrode 130. The first and second semiconductor layer contact holes 142 and 144 are formed within the gate insulating layer 120 in FIG. 2. Alternatively, the first and second semiconductor layer contact holes 142 and 144 are formed only within the interlayer insulating layer 140 when the gate insulating layer 120 is patterned identically as the gate electrode 130.

A source electrode 152 and a drain electrode 154, which are made of conductive material such as a metal, are disposed on the interlayer insulating layer 140. The source electrode 152 and the drain electrode 154 are spaced apart from each other with respect to the gate electrode 130, and contact both sides of the semiconductor layer 110 through the first and second semiconductor layer contact holes 142 and 144, respectively.

The semiconductor layer 110, the gate electrode 130, the source electrode 152 and the drain electrode 154 constitute the thin film transistor Tr, which acts as a driving element. The thin film transistor Tr in FIG. 2 has a coplanar structure in which the gate electrode 130, the source electrode 152 and the drain electrode 154 are disposed over the semiconductor layer 110. Alternatively, the thin film transistor Tr may have an inverted staggered structure in which a gate electrode is disposed under a semiconductor layer and a source and drain electrodes are disposed over the semiconductor layer. In this case, the semiconductor layer may include amorphous silicon.

Although not shown in FIG. 2, a gate line and a data line, which cross each other to define a pixel region, and a switching element, which is connected to the gate line and the data line, is may be further formed in the pixel region. The switching element is connected to the thin film transistor Tr, which is a driving element. In addition, a power line is spaced apart in parallel from the gate line or the data line, and the thin film transistor Tr may further include a storage capacitor configured to constantly keep a voltage of the gate electrode for one frame.

A passivation layer 160 is disposed on the source and drain electrodes 152 and 154 with covering the thin film transistor Tr over the whole substrate 102. The passivation layer 160 has a flat top surface and a drain contact hole 162 that exposes the drain electrode 154 of the thin film transistor Tr. While the drain contact hole 162 is disposed on the second semiconductor layer contact hole 144, it may be spaced apart from the second semiconductor layer contact hole 144.

The organic light emitting diode (OLED) D includes a first electrode 210 that is disposed on the passivation layer 160 and connected to the drain electrode 154 of the thin film transistor Tr. The organic light emitting diode D further includes an emissive layer 230 and a second electrode 220 each of which is disposed sequentially on the first electrode 210.

The first electrode 210 is disposed in each pixel region. The first electrode 210 may be an anode and include conductive material having relatively high work function value. For example, the first electrode 210 may include, but is not limited to, a transparent conductive material such as indium tin oxide (ITO), indium zinc oxide (IZO), indium tin zinc oxide (ITZO), SnO, ZnO, indium cerium oxide (ICO), aluminum doped zinc oxide (AZO), and the like.

In one aspect, when the organic light emitting display device 100 is a top-emission type, a reflective electrode or a reflective layer may be disposed under the first electrode 210. For example, the reflective electrode or the reflective layer may include, but is not limited to, Ag or aluminum-palladium-copper (APC) alloy.

In addition, a bank layer 164 is disposed on the passivation layer 160 in order to cover edges of the first electrode 210. The bank layer 164 exposes a center of the first electrode 210. The bank layer 164 may be omitted.

An emissive layer 230 is disposed on the first electrode 210. In one embodiment, the emissive layer 230 may have multiple emitting parts 300, 400, 400A, 500, 600, 600A and 700 and at least one charge generation layer 370, 570 and 670 (FIGS. 3, 5-6 and 8). Each of the emitting parts 300, 400, 400A, 500, 600, 600A and 700 includes at least one emitting material layer (EML), and may further comprise at least one of a hole injection layer (HIL), a hole transport layer (HTL), an electron blocking layer (EBL), a hole blocking layer (HBL), an electron transport layer (ETL) and/or an electron injection layer (EIL).

The second electrode 220 is disposed over the substrate 102 above which the emissive layer 230 is disposed. The second electrode 220 may be disposed over a whole display area, and may include a conductive material with a relatively low work function value compared to the first electrode 210, and may be a cathode. For example, the second electrode 220 may include, but is not limited to, aluminum (Al), magnesium (Mg), calcium (Ca), silver (Ag), alloy thereof or combination thereof such as aluminum-magnesium alloy (Al—Mg). As an example, since the light emitted from the emissive layer 230 is incident to the color filter layer 180 through the second electrode 220 in the organic light emitting display device 100, the second electrode 220 has a thin thickness so that the light can be transmitted.

In addition, an encapsulation film may be disposed over the OLED D in order to prevent outer moisture from penetrating into the OLED D. The encapsulation film 170 may have, but is not limited to, a laminated structure of a first inorganic insulating film, an organic insulating film and a second inorganic insulating film. The encapsulation film may be omitted.

A polarizing plate may be attached onto the second substrate 104 to reduce reflection of external light. For example, the polarizing plate may be a circular polarizing plate. Further, a cover window may be attached onto the second substrate 104 or the polarizing plate. In this case, the first and second substrates 102 and 104 and the cover window have flexible properties so that a flexible display device can be constructed.

The color filter layer 180 is disposed over the OLED D and includes a red color filter 182, a green color filter 184 and a blue color filter 186 each of which is disposed correspondingly to the red pixel region RP, the green pixel region GP and the blue pixel region BP, respectively. Although not shown in FIG. 2, the color filter layer 180 may be attached to the OLED D through an adhesive layer. Alternatively, the color filter layer 180 may be disposed directly on the OLED D.

In FIG. 2, the light emitted from the OLED D is transmitted through the second electrode 220 and the color filter layer 180 is disposed over the OLED D. Alternatively, the light emitted from the OLED D is transmitted through the first electrode 210 and the color filter layer 180 may be disposed between the OLED D and the first substrate 102. In addition, a color conversion layer may be formed between the OLED D and the color filter layer 180. The color conversion layer may include a red color conversion layer, a green color conversion layer and a blue color conversion layer each of which is disposed correspondingly to each pixel region (RP, GP and BP), respectively, so as to convert the white (W) color light to each of a red, green and blue color lights, respectively.

As described above, the white (W) color light emitted from the OLED D is transmitted through the red color filter 182, the green color filter 184 and the blue color filter 186 each of which is disposed correspondingly to the red pixel region RP, the green pixel region GP and the blue pixel region BP, respectively, so that red, green and blue color lights are displayed in the red pixel region RP, the green pixel region GP and the blue pixel region BP.

Figure 3:
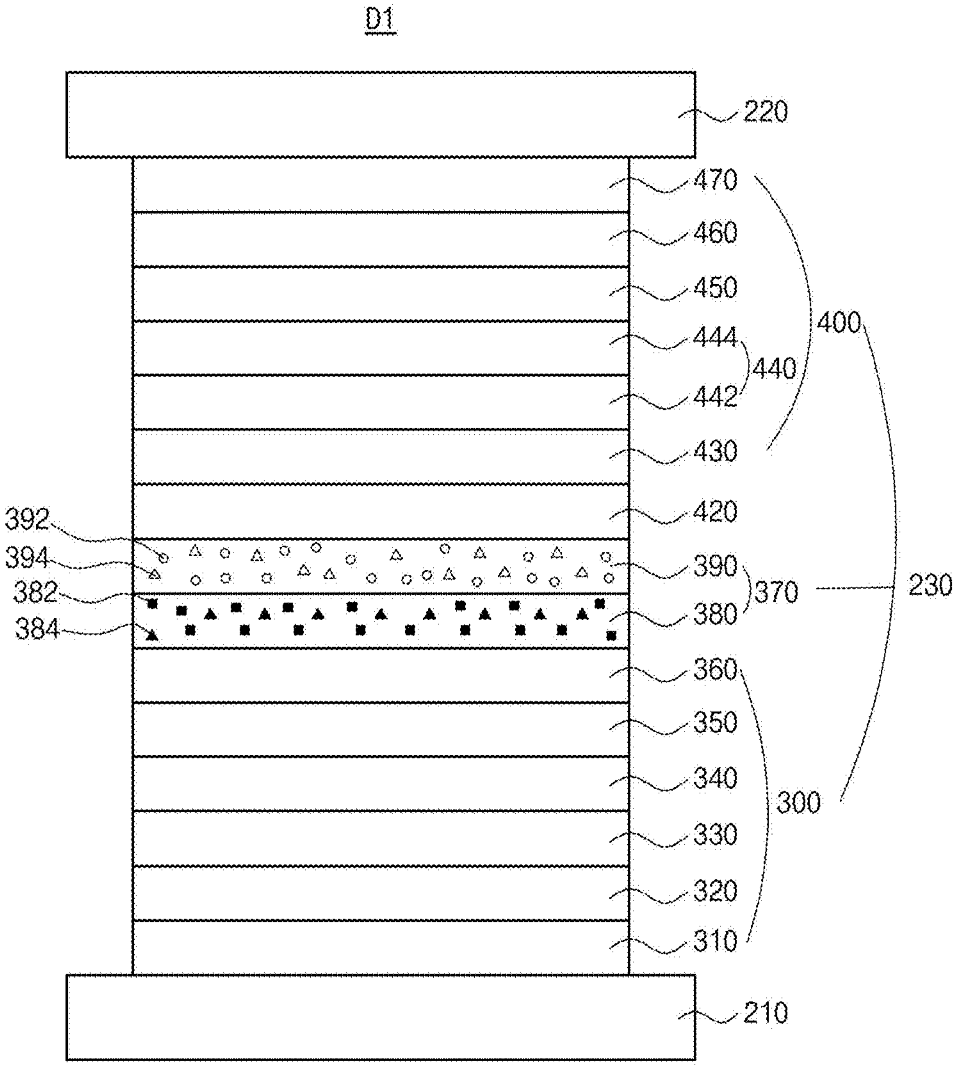
FIG. 3 is a cross-sectional view illustrating an organic light emitting diode having two emitting parts in accordance with an aspect of the present disclosure.

Now, we will describe the OLED in more detail. FIG. 3 is a schematic cross-sectional view illustrating an organic light emitting diode having two emitting parts to form a tandem structure in accordance with an aspect of the present disclosure.

As illustrated in FIG. 3, the organic light emitting diode (OLED) D1 includes first and second electrodes 210 and 220 facing each other and an emissive layer 230 disposed between the first and second electrodes 210 and 220. The emissive layer 230 includes a first emitting part 300 disposed between the first and second electrodes 210 and 220, a second emitting part 400 disposed between the first emitting part 300 and the second electrode 220 and a charge generation layer (CGL) 370 disposed between the first and second emitting parts 300 and 400.

The first emitting part 300 includes a first emitting material layer (EML1) 340. The first emitting part 300 may further include at least one of an HIL 310 and a first HTL (HTL1) 320 disposed sequentially between the first electrode and the EML1 340 and a first ETL (ETL1) 360 disposed between the EML1 340 and the CGL 370. Alternatively, the first emitting part 300 may further comprise at least one a first EBL (EBL1) 330 disposed between the HTL1 320 and the EML1 340 and a first HBL (HBL1) 350 disposed between the EML1 340 and the ETL1 360.

The second emitting part 400 includes a second emitting material layer (EML2) 440. The second emitting part 400 may further include at least one of a second HTL (HTL2) 420 disposed between the CGL 370 and the EML2 440 and a second ETL (ETL2) 460 and an EIL 470 disposed sequentially between the EML2 440 and the second electrode 220. Alternatively, the second emitting part 400 may further comprise at least one of a second EBL (EBL2) 430 disposed between the HTL2 420 and the EML2 440 and a second HBL (HBL2) 450 disposed between the EML2 440 and the ETL2 460.

As an example, the EML1 340 may be a blue emitting material layer and the EML2 440 may be an emitting material layer emitting light with longer wavelength peak than the light emitted from the blue emitting material layer, so that the OLED D1 can emit white (W) light. Each of the EML1 340 and the EML2 440 may include a host and a dopant, respectively. The contents of the dopant in each EML may be, but is not limited to, between about 1 wt % and about 50 wt %, for example, about 1 wt % and about 30 wt %.

The HIL 310 is disposed between the first electrode 210 and the HTL1 320 and improves an interface property between the inorganic first electrode 210 and the organic HTL1 320. In one aspect, the HIL 310 may include, but is not limited to, 4,4'4"-Tris(3-methylphenylamino)triphenylamine (MTDATA), 4,4',4"-Tris(N,N-diphenyl-amino)triphenylamine (NATA), 4,4',4"-Tris(N-(naphthalene-1-yl)-N-phenyl-amino)triphenylamine (1T-NATA), 4,4',4"-Tris(N-(naphthalene-2-yl)-N-phenyl-amino)triphenylamine (2T-NATA), Copper phthalocyanine (CuPc), Tris(4-carbazoyl-9-yl-phenyl)amine (TCTA), N,N'-Diphenyl-N,N'-bis(1-naphthyl)-1,1'-biphenyl-4,4"-diamine (NPB; NPD), 1,4,5,8,9,11-Hexaazatriphenylenehexacarbonitrile (Dipyrazino[2,3-f:2'3'-h]quinoxaline-2,3,6,7,10,11-hexacarbonitrile; HAT-CN), 1,3,5-tris[4-(diphenylamino)phenyl]benzene (TDAPB), poly(3,4-ethylenedioxythiphene)polystyrene sulfonate (PEDOT/PSS), 2,3,5,6-tetrafluoro-7,7,8,8-tetracyanoquinodimethane (F4TCNQ), N-(biphenyl-4-yl)-9,9-dimethyl-N-(4-(9-phenyl-9H-carbazol-3-yl)phenyl)-9H-fluoren-2-amine and combination thereof. The HIL 310 may be omitted in compliance of the OLED D1 property.

The HTL1 320 is disposed adjacently to EML1 340 and the HTL2 420 is disposed adjacently to the EML2 440. In one embodiment, each of the HTL1 320 and HTL2 420 may include, but is not limited to, N,N-Diphenyl-N,N'-bis(3-methylphenyl-1,1'-biphenyl-4,4'-diamine (TPD), NPB (NPD), N,N'-bis[4-[bis(3-methylphenyl)amino]phenyl]-N,N'-diphenyl-[1,1'-biphenyl]-4,4'-diamine (DNTPD), 4,4'-bis(N-carbazolyl)-1,1'-biphenyl (CBP), Poly[N,N'-bis(4-butylphenyl)-N,N'-bis(phenyl)-benzidine] (Poly-TPD), Poly[(9,9-dioctylfluorenyl-2,7-diyl)-co-(4,4'-(N-(4-sec-butylphenyl)diphenylamine))] (TFB), 1,1-bis(4-(N,N'-di(p-tolyl)amino)phenyl)cyclohexane (TAPC), 3,5-Di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-Biphenyl]-4-yl)-9,9-dimethyl-N-(4-(9-phenl-9H-carbazol-3-yl)phenyl)-9H-fluoren-2-amine, N4,N4,N4',N4'-tetrakis([1,1'-biphenyl]-4-yl)-[1,1'-biphenyl]-4,4'-diamine and combination thereof, respectively.

Each of the ETL1 360 and the ETL2 460 includes material having high electron mobility so as to provide electrons stably with each of the EML1 340 and the EML2 440 by fast electron transportation, respectively. In one aspect, each of the ETL1 360 and the ETL2 460 may comprise, but is not limited to, any one of oxadiazole-based compounds, triazole-based compounds, phenanthroline-based compounds, benzoxazole-based compounds, benzothiazole-based compounds, benzimidazole-based compounds, triazine-based compounds, and the like, respectively.

As an example, each of the ETL1 360 and the ETL2 460 may comprise independently, but is not limited to, tris-(8-hydroxyquinoline aluminum ($Alq_3$), 2-biphenyl-4-yl-5-(4-t-butylphenyl)-1,3,4-oxadiazole (PBD), spiro-PBD, lithium quinolate (Liq), 1,3,5-Tris(N-phenylbenzimidazol-2-yl)benzene (TPBi), Bis(2-methyl-8-quinolinolato-N1,O8)-(1,1'-biphenyl-4-olato)aluminum (BAlq), 4,7-diphenyl-1,10-phenanthroline (Bphen), 2,9-Bis(naphthalene-2-yl)4,7-diphenyl-1,10-phenanthroline (NBphen), 2,9-Dimethyl-4,7-diphenyl-1,10-phenaathroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Trip-pyrid-3-yl-phenyl)benzene (TpPyPB), 1,3,5-Tri(m-pyrid-3-yl-phenyl)benzene (TmPyPB), 2,4,6-Tris(3'-(pyridin-3-yl)biphenyl-3-yl)1,3,5-triazine (TmPPPyTz), Poly[9,9-bis(3'-(N,N-dimethyl)-N-ethylammonium)-propyl)-2,7-fluorene]-alt-2,7-(9,9-dioctylfluorene)] (PFNBr), tris(phenylquinoxaline) (TPQ), TSPO1, 2-[4-(9,10-Di-2-naphthalen2-yl-2-anthracen-2-yl)phenyl]-1-phenyl-1H-benzimidazole (ZADN) and combination thereof, respectively.

The EIL 470 is disposed between the ETL2 460 and the second electrode 220, and can improve physical properties of the second electrode 220 and therefore, can enhance the luminous lifespan of the OLED D1. In one aspect, the EIL 470 may comprise, but is not limited to, an alkali metal halide or an alkaline earth metal halide such as LiF, CsF, NaF, $BaF_2$ and the like, and/or an organic metal compound such as Liq, lithium benzoate, sodium stearate, and the like. The EIL 470 may be omitted in accordance with the OLED D1 structure.

When holes are transferred to the second electrode 220 and/or electrons are transferred to the first electrode 210, the OLED D1 may have short lifespan and reduced luminous efficiency. Each of the first and second emitting parts 300 and 400 may have at least one exciton blocking layer disposed adjacently to each of the EML1 340 and the EML2 440.

Each of the EBL1 330 and the EBL2 430 is disposed between the HTL1 320 or the HTL2 420 and the EML1 340 and the EML2 440 so as to control and prevent electron transport between those layers. As an example, each of the EBL1 330 and the EBL2 430 may comprise independently, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, 1-3-Bis(carbazoly-9-yl)benzene (mCP), 3,3-Di(9H-carbazol-9-yl)biphenyl (mCBP), CuPc, N,N'-bis[4-(bis(3-methylphenyl)amino)phenyl]-N,N'-diphenyl-[1,1'-biphenyl]-4,4'-diamine (DNTPD), TDAPB, DCDPA, 2,8-bis(9-phenyl-9H-carbazol-3-yl)dibenzo([b,d]thiophene and combination thereof, respectively.

In addition, each of the HBL1 350 and the HBL2 450 is disposed between the EML1 340 or the EML2 440 and the ETL1 360 and the ETL2 460 so as to control and prevent hole transport between those layers. In one aspect, each of the HBL1 350 and the HBL2 450 may comprise independently, but is not limited to, any one of oxadiazole-based compounds, triazole-based compounds, phenanthroline-based compounds, benzoxazole-based compounds, benzothiazole-based compounds, benzimidazole-based compounds, and triazine-based compounds and the likes each of which can be used in each of the ETL1 360 and the ETL2 460, respectively.

As an example, each of the HBL1 350 and the HBL2 450 may comprise a compound having a relatively low highest occupied molecular orbital (HOMO) energy level compared to the HOMO energy level of the luminescent materials in each of the EML1 340 and the EML2 440. For example, each of the HBL1 350 and the HBL2 450 may comprise, but is not limited to, $Alq_3$, BAlq, Liq, PBD, spiro-PBD, BCP, TSPO1, Bis-4,5-(3,5-di-3-pyridylphenyl)-2-methylpyrimidine (B3PYMPM), DPEPO, 9-(6-(9H-carbazol-9-yl)pyridine-3-yl)-9H-3,9'-bicarbazole and combination thereof, respectively.

As described above, the EML1 340 may be a blue emitting material layer. For example, the EML1 340 may comprise one of a blue emitting material layer, a dark blue emitting material layer and a sky blue emitting material layer. In this case, the EML1 340 may emit light with a photoluminescence peak between about 440 nm and about 480 nm.

The EML1 may include blue host and blue dopant. For example, the blue host may include, but is not limited to, mCP, 9-(3-(9H-carbazol-9-yl)phenyl)-9H-carbazole-3-carbonitrile (mCP-CN), mCBP, CBP-CN, 9-(3-(9H-Carbazol-9-yl)phenyl)-3-(diphenylphosphoryl)-9H-carbazole (mCPPO1) 3,5-Di(9H-carbazol-9-yl)biphenyl (Ph-mCP), TSPO1, 9-(3'-(9H-carbazol-9-yl)-[1,1'-biphenyl]-3-yl)-9H-pyrido[2,3-b]indole (CzBPCb), Bis(2-methylphenyl)diphenylsilane (UGH-1), 1,4-Bis(triphenylsilyl)benzene (UGH-2), 1,3-Bis(triphenylsilyl)benzene (UGH-3), 9,9-Spiorobifluoren-2-yl-diphenyl-phosphine oxide (SPPO1), 9,9'-(5-(Triphenylsilyl)-1,3-phenylene)bis(9H-carbazole) (SimCP), 9,10-di(naphthyl-2-yl)-anthracene (2-ADN) and combination thereof.

The blue dopant may comprise at least one of blue phosphorescent material, blue fluorescent material and blue delayed fluorescent material. For example, the blue (B) dopant may comprise, but is not limited to, perylene, 4,4'-Bis[4-(di-p-tolylamino)styryl]biphenyl (DPAVBi), 4-(Di-p-tolylamino)-4-4'-[(di-p-tolylamino)styryl]stilbene (DPAVB), 4,4'-Bis[4-(diphenylamino)styryl]biphenyl (BDAVBi), 2,7-Bis(4-diphenylamino)styryl)-9,9-spiorfluorene (spiro-DPVBi), [1,4-bis[2-[4-[N,N-di(p-tolyl)amino]phenyl]vinyl] benzene (DSB), 1-4-di44-(N,N-diphenyl)amino]styryl-benzene (DSA), 2,5,8,11-Tetra-tetrbutylperylene (TBPe), Bis(2-hydroxylphenyl)-pyridine)beryllium ($Bepp_2$), 9-(9-Phenylcarbazole-3-yl)-10-(naphthalene-1-yl)anthracene (PCAN), 1,6-Bis(diphenylamine)pyrene, mer-Tris(1-phenyl-3-methylimidazolin-2-ylidene-C,C(2)'iridium(III) (mer-Ir($pmi)_3$), fac-Tris(1,3-diphenyl-benzimidazolin-2-ylidene-C,C(2)'iridium(III) (fac-Ir($dpbic)_3$), Bis(3,4,5-trifluoro-2-(2-pyridyl)phenyl-(2-carboxypyridyl)iridium(III) (Ir(tfpd)$_2$pic), tris(2-(4,6-difluorophenyl)pyridine))iridium(III) (Ir (Fppy)$_3$), Bis[2-(4,6-difluorophenyl)pyridinato-C$^2$,N](picolinato)iridium(III) (FIrpic) and combination thereof.

The EML2 440 emits light with photoluminescence peak longer than the light emitted from the EML1 340, and may comprise a green (G) emitting material layer. For example, the EML2 440 include a red (R) emitting material layer 442 disposed between the EBL2 430 and the HBL 450 and the green (G) emitting material layer 444 so that the EML2 440 may emit red-green light. When the EML2 440 emits red-green light, the EML2 440 may emit light of wavelength between about 510 nm and about 650 nm.

The red (R) emitting material layer 442 may include red (R) host and red (R) dopant. For example, the red (R)0 host may comprise, but is not limited to, 9,9'-Diphenyl-9H,9'H-3,3'-bicarbazole (BCzPh), CBP, 1,3,5-Tris(carbazole-9-yl)benzene (TCP), TCTA, 4,4'-Bis(carbazole-9-yl)-2,2'-dimethylbipheyl (CDBP), 2,7-Bis(carbazole-9-yl)-9,9-dimethylfluorene (DMFL-CBP), 2,2',7,7'-Tetrakis(carbazole-9-yl)-9,9-spiorofluorene (spiro-CBP), DPEPO, 4'-(9H-carbazol-9-yl)biphenyl-3,5-dicarbonitrile (PCzB-2CN), 3'-(9H-carbazol-9-yl)biphenyl-3,5-dicarbonitrile (mCzB-2CN), 3,6-Bis(carbazole-9-yl)-9-(2-ethyl-hexyl)-9H-carbazole (TCz1), Bepp$_2$, Bis(10-hydroxylbenzo[h] quinolinato)beryllium (Bebq$_2$), 1,3,5-Tris(1-pyrenyl)benzene (TPB3) and combination thereof.

The red (R) dopant may comprise at least one of red phosphorescent material, red fluorescent material and red delayed fluorescent material. For example, the red (R) dopant may comprise, but is not limited to, Tris(1-phenylisoquinoline)iridium (III) (Ir(piq)$_3$), [Bis(2-(4,6-dimethyl)phenylquinoline)](2,2,6,6-tetramethylheptane-3,5-dionate) iridium (III), Bis[2-(4-n-hexylphenyl)quinoline](acetylacetonate)iridium (III) (Hex-Ir(phq)$_2$(acac)), Tris[2-(4-n-hexylphenyl)quinoline]iridium(III) (Hex-Ir(phq)$_3$), Tris[2-phenyl-4-methylquinoline]iridium(III) (Ir(Mphq)$_3$), Bis(2-phenylquinoline)(2,2,6,6-tetramethylheptene-3,5-dionate)iridium(III) (Ir(dpm)PQ$_2$), Bis(phenylisoquinoline)(2,2,6,6-tetramethylheptene-3,5-dionate)iridium(III) (Ir(dpm)(piq)$_2$), Bis[(4-n-hexylphenyl)isoquinoline](acetylacetonate)iridium(III) (Hex-Ir(piq)$_2$(acac)), Tris[2-(4-n-hexylphenyl)quinoline]iridium(III) (Hex-Ir(piq)$_3$), Tris(2-(3-methylphenyl)-7-methyl-quinolato)iridium (Ir(dmpq)$_3$), Bis[2-(2-methylphenyl)-7-methyl-quinoline](acetylacetonate) iridium(III) (Ir(dmpq)$_2$(acac)), Bis[2-(3,5-dimethylphenyl)-4-methyl-quinoline](acetylacetonate)iridium(III) (Ir(mphmq)$_2$(acac)), Tris(dibenzoylmethane)mono(1,10-phenanthroline)europium(III) (Eu(dbm)$_3$(phen)) and combination thereof.

The green (G) emitting material layer 444 may comprise green (G) host and green (G) dopant. For example, the green (G) host may comprise, but is not limited to, BCzPh, CBP, TCP, TCTA, CDBP, DMFL-CBP, Spiro-CBP, DPEPO, PCzB-2CN, mCzB-2CN, TCz1 and combination thereof. The green (G) dopant may comprise at least one of green phosphorescent material, green fluorescent material and green delayed fluorescent material For example, the green (G) dopant may comprise, but is not limited to, [Bis(2-phenylpyridine)](pyridyl-2-benzofuro[2,3-b]pyridine) iridium, Tris(2-phenylpyridine)iridium(III) (Ir(ppy)$_3$), fac-Tris(2-phenylpyridine)iridium(III) (fac-Ir(ppy)$_3$), Bis(2-phenylpyridine)(acetylacetonate)iridium(III) (Ir(ppy)$_2$(acac)), Tris[2-(p-tolyl)pyridine]iridium(III) (Ir(mppy)$_3$), Bis(2-(naphthalene-2-yl)pyridine)(acetylacetonate)iridium(III) (Ir(npy)$_2$acac), Tris(2-phenyl-3-methyl-pyridine) iridium (Ir(3mppy)$_3$), fac-Tris(2-(3-p-xylyl)phenyl)pyridine iridium(III)(TEG), Alq$_3$ and combination thereof.

The CGL 370 is disposed between the first emitting part 300 and the second emitting part 400. The CGL 370 generates charges and controls charge injection balance between the first emitting part 300 and the second emitting part 400.

The CGL 370 includes an N-type CGL (N-CGL) 380 disposed adjacently to the first emitting part 300 and n P-type CGL (P-CGL) 390 disposed adjacently to the second emitting part 400. The N-CGL 380 provides electrons into the first emitting part 300 and the P-CGL 390 provides holes into the second emitting part 400. The N-CGL 380 may include N-type host 382 and N-type dopant 384, and the P-CGL 390 may include P-type host 392 and P-type dopant 394. Each of the N-type host 382 and the P-type host 392 may form medium or matrix for each of the N-CGL 380 and the P-CGL 390, respectively.

The P-type host 392 in the P-CGL 390 renders holes generated in the P-CGL 390 to be injected into the EML2 440 through its own HOMO energy level. For example, the P-type dopant 394 may generally have strong electron withdrawing group within its molecule. Therefore, the P-type dopant 394 receives electrons at its own lowest unoccupied molecular orbital (LUMO) energy level from the HOMO energy level of the P-type host 392 or the hole transport material in the HTL2 disposed adjacently to the P-CGL 390, so that the P-type dopant 394 may form a path for transporting holes from the P-CGL 390 to the EML2 440.

Figure 4:
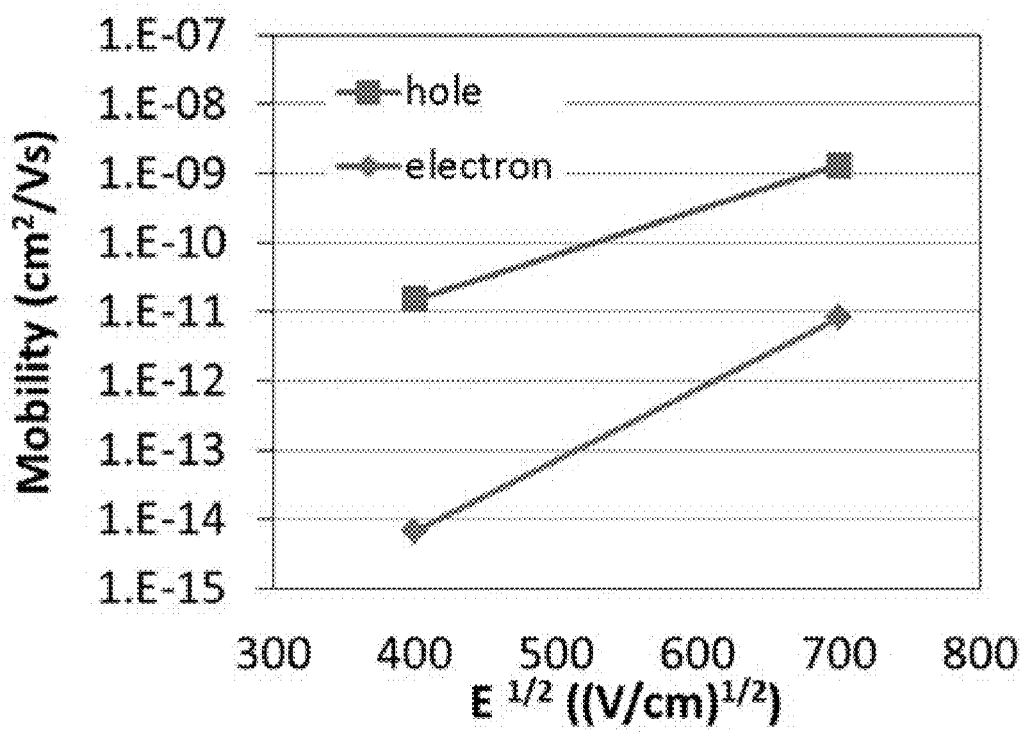
FIG. 4 is a graph illustrating relative charge mobility in accordance with current density.

As illustrated in FIG. 4, there is a large difference in charge mobility in accordance with gradation or current density, particularly, in an emitting material layer including the green emitting material layer 444. While the difference between hole mobility and electron mobility in the low gradation period (low current density period) is relatively large, the difference between hole mobility and electron mobility in the high gradation period (high current density period) is relatively small. In particular, as shifted to the high gradation periods, the electron mobility is relatively significantly increased compared to the hole mobility.

Since the electron mobility increases closely to the hole mobility within the high gradation period in the EML2 440 including the green emitting material layer 444, the emission area is uniformly formed over the entire of the red emitting material layer 442 and the green emitting material layer 444 in the EML2 440. However, the amount of green light emitting from the EML2 440 is relatively decreased in the high gradation section. In other words, since the green light component in the white light emitted from the OLED D1 in the high gradation section is relatively small, the chromaticity value of the X-axis is relatively larger than the chromaticity value of the Y-axis in the CIE chromaticity distribution for the white light.

On the other hand, holes excessively injected into the green emitting material layer 444 are quenched without forming excitons in the low gradation period, which results in efficiency roll-off that rapidly decreases its luminous efficiency in high luminance. In addition, as described above, holes are injected into the EML2 440 very quickly compared to electrons in the low gradation section. In the low gradation period, the emission area of the EML2 440 is mainly formed on the green emitting material layer 444 disposed relatively adjacent to second electrode 220, and the EML2 440 emits light close to green color. In other words, in the high gradation period, the white light emitting from the OLED D1 has relatively small amount of green component, that is, chromaticity value of the X-axis of the white light is relatively larger than the chromaticity value of Y-axis in the CIE chromaticity distribution. In contrast, in the low gradation period, the white light emitted from the OLED D1 has relatively large amount of green component, that is, chromaticity value of the Y-axis of the white light is relatively larger than the chromaticity value of the X-axis in the CIE chromaticity distribution by color conversion.

In other words, in the EML2 440 including the green emitting material layer 444, the amount of green component of the white light emitted from the OLED D1 is relatively large in the low gradation section, while the amount of green component of the white light is relatively small in the high gradation section.

Therefore, when the chromaticity of the X-axis for the white light is compensated to realize white balance by controlling the green light which is emitted relatively large in the low gradation section where color inversion occurs, the chromaticity of the X-axis of the white light in the high gradation section is over-compensated. In contrast, when the chromaticity of the Y-axis for the white light is compensated to realize white balance by increasing the green light which is emitted relatively small in the high gradation section, the chromaticity of the Y-axis of the white light in the low gradation where color conversion occurs is over-compensated. When optical compensation is done, a panel defect may occur since color compensation is not properly performed according to color-converted gradation sections.

The P-type host 392 is designed to have its HOMO energy level $HOMO^H$ similar to the LUMO energy level $LUMO^D$ of the P-type dopant 394 in the general P-CGL 390 constituting the OLED having the tandem structure, in consideration of hole generation as well as hole mobility and hole injection into the EML2 440. In other words, the P-type host 392 and the P-type dopant 394 are selected such that an energy bandgap between the HOMO energy level $HOMO^H$ of the P-type host 392 and the LUMO energy level $LUMO^D$ of the P-type dopant 394 within the general P-CGL 390 have at least 0.01 eV to 0.1 eV.

When the energy bandgap between the HOMO energy level $HOMO^H$ of the P-type host 392 and the LUMO energy level $LUMO^D$ of the P-type dopant 394 is minimally designed, the EML 440 emits relatively large amount of light close to green light since the hole mobility is significantly higher than the electron mobility in the low gradation period. In addition, holes excessively injected into the green emitting material layer 444 are quenched without forming excitons in the low gradation period, which results in efficiency roll-off of green light in high luminance. Such efficiency roll-off causes the EML 440 to emit relatively large amount of light close to red light in the high gradation period. Accordingly, the white light emitted from the OLED D1 in the low gradation period contains relatively large amount of green light, while the light emitted from the OLED D1 in the high gradation period contains relatively large amount of red light.

Therefore, it is very difficult to perform color compensation efficiently according to gradation or current density in an organic light emitting diode having the general P-type CGL. For example, in case of compensating the chromaticity of Y-axis that is insufficient in the CIE chromaticity distribution of white light in the high gradation period, the white light in the low gradation period where green light has already excessively emitted by color conversion is shifted further to green light. In the low gradation period, since the color compensation is performed in a way that further reinforces the green light that has already been emitted excessively, the white balance is distorted, causing panel failure.

In contrast, the P-type host 392 in the P-CGL 390 is designed to have HOMO energy level $HOMO^H$ deeper than general P-type host and the P-type dopant 394 in the P-CGL 390 is designed to have LUMO energy level LUMOD shallower than general P-type dopant. For example, an energy bandgap ΔE1 between the HOMO energy level $HOMO^H$ of the P-type host 392 and the LUMO energy level $LUMO^D$ of the P-type dopant 394 may satisfy a relationship of the following Formula A:

$$0.35\ \text{eV} \leq LUMO^D - HOMO^H \leq 0.5\ \text{eV}. \qquad \text{Formula A:}$$

When the energy bandgap ΔE1 between the HOMO energy level $HOMO^H$ of the P-type host 392 and the LUMO energy level $LUMO^D$ of the P-type dopant 394 satisfies the relationship of Formula A, the hole generation as well as the hole mobility to the EML2 440 and hole conductivity in the P-CGL 390 are decreased. As the amount of holes injected into the green emitting material layer 444 in the EML 440 is decreased, holes and electrons can be injected in balance into the green emitting material layer 444. As the holes and electrons are injected in balance into the green emitting material layer 444, the amount of charges without forming excitons is decreased, and thus, the roll-off in the green emitting material layer 444 can be reduced or minimized.

Accordingly, in case of introducing the P-type host 392 and the P-type dopant 394 satisfying the relationship of Formula A into the P-CGL 390, the amount of green light among the light emitted from the EML2 440 can be maintained constantly irrespective of the gradation or the current density, and thus the white light emitted from the OLED D1 can keep constant values, e.g., the chromaticity of Y-axis is larger than the chromaticity of X-axis in the CIE chromaticity distribution irrespective of the gradation or the current density.

If only the X-axis chromaticity is compensated for the white light having a constant chromaticity regardless of gradation, efficient white balance can be realized in both the low gradation section and the high gradation section. In other words, since white light having the constant chromaticity without chromaticity conversion by the gradation or current density is emitted from the OLED D1, efficient optical compensation can be performed.

In contrast, when the energy bandgap ΔE1 between the HOMO energy level $HOMO^H$ of the P-type host 392 and the LUMO energy level $LUMO^D$ of the P-type dopant 394 is less than the relationship of Formula A, charges cannot be injected in balance into the EML2 440 and color conversion is caused, so that optical conversation may be insufficient. In addition, when the energy bandgap ΔE1 between the HOMO energy level $HOMO^H$ of the P-type host 392 and the LUMO energy level $LUMO^D$ of the P-type dopant 394 exceeds the ranges in the relationship of Formula A, holes may not be sufficiently injected into the EML2 440, which causes the OLED D1 to raise its driving voltage and to lower its luminous efficiency.

The P-type host 392 satisfying the relationship of Formula A may include an organic compound having HOMO energy level between about −5.0 eV and about −6.0 eV, for example, about −5.2 eV and −5.5 eV. As an example, the P-type host 392 may include, but is not limited to, an anthracene-based compound having the following structure of Formula 1 and/or a spirofluorene-based compound having the following structure of Formula 3:

Formula 1

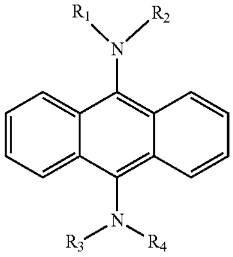

wherein each of $R_1$ to $R_4$ is independently a $C_6$-$C_{30}$ aryl group or a $C_3$-$C_{30}$ hetero aryl group, each of the aryl group and the hetero aryl group may be unsubstituted or substituted with at least one $C_1$-$C_{10}$ alkyl group;

Formula 3

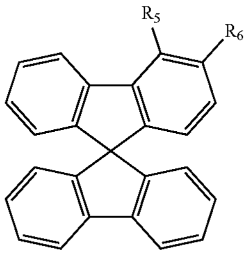

wherein each of $R_5$ and $R_6$ is independently protium, deuterium, a carbazolyl group or

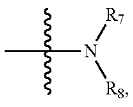

at least one of $R_5$ and $R_6$ is a carbazolyl group or

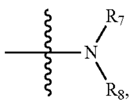

wherein each of $R_7$ and $R_8$ is independently a $C_6$-$C_{30}$ aryl group or a $C_3$-$C_{30}$ hetero aryl group, and wherein each of the carbazolyl group, the aryl group and the hetero aryl group may be independently unsubstituted or substituted with at least one $C_1$-$C_{10}$ alkyl group, and at least one of $R_7$ and $R_8$ may be a poly-cyclic aryl group or a poly-cyclic hetero aryl group.

For example, each of $R_1$ to $R_4$ in Formula 1 may independently comprise, but is not limited to, an aryl group such as phenyl, naphthyl and phenanthrenyl each of which may be unsubstituted or substituted with a $C_1$-$C_{10}$ alkyl group. As an example, the anthracene-based compound having the structure of Formula 1 may be selected from, but is not limited to, the following organic compounds of Formula 2:

Formula 2

1-1

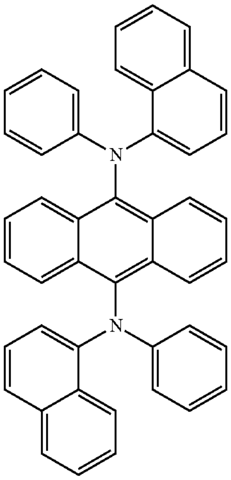

1-2

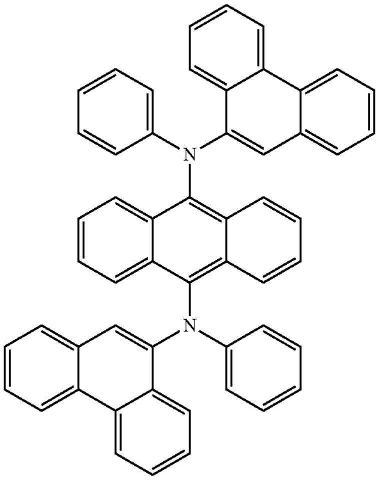

1-3

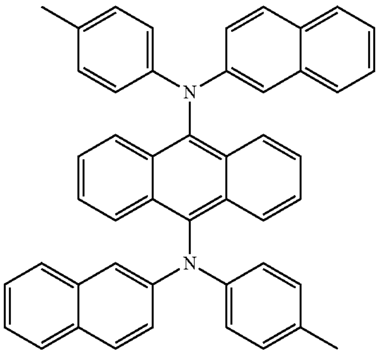

-continued 1-4

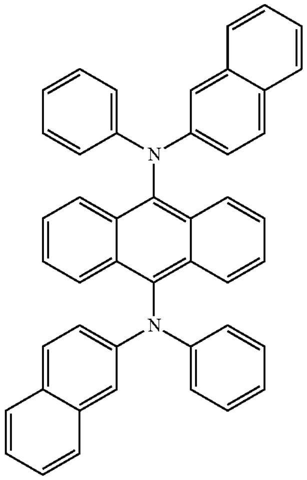

In addition, one of $R_7$ and $R_8$ in Formula 3 may be phenyl, biphenyl, naphthyl or anthracenyl, and the other of $R_7$ and $R_8$ in Formula 3 may be unsubstituted or at least one $C_1$-$C_{10}$ alkyl substituted fluorenyl, but is not limited thereto. As an example, the spirofluorene-based compound having the structure of Formula 3 may be selected from, but is not limited to, the following organic compounds of Formula 4:

Formula 4

2-1

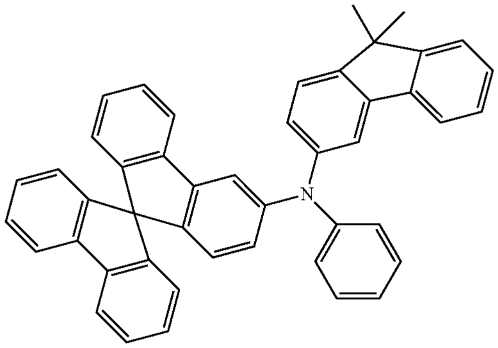

2-2

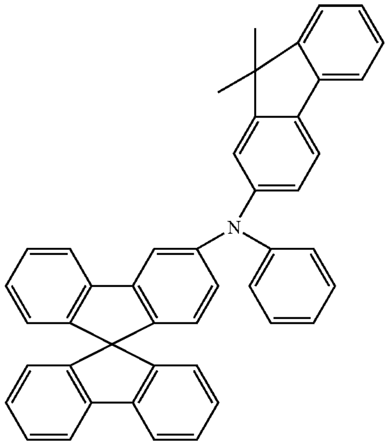

-continued 2-3

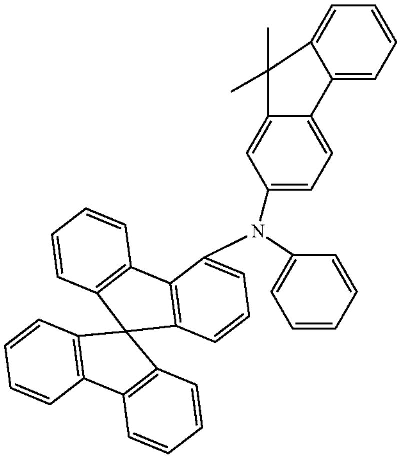

2-4

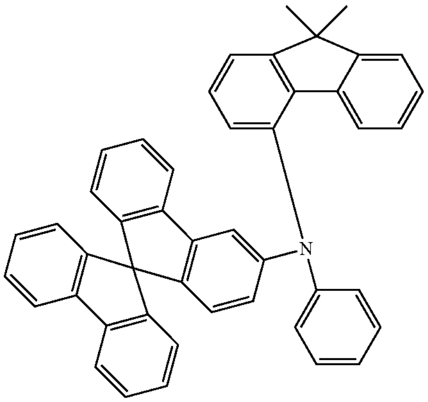

2-5

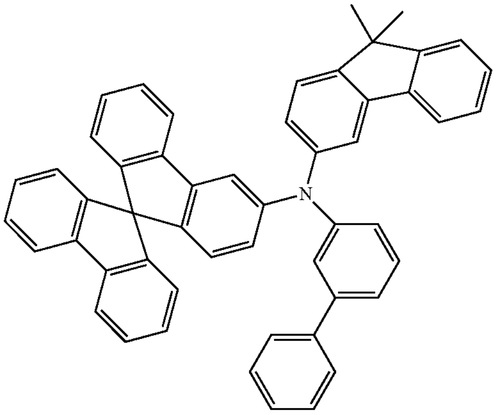

-continued 2-6

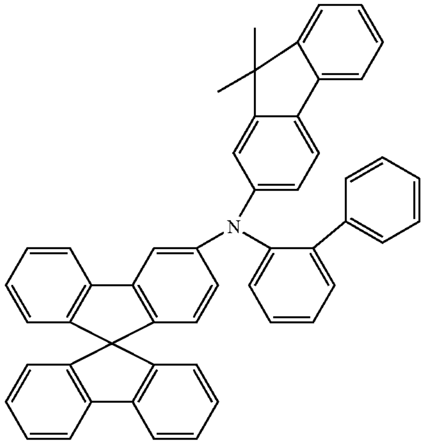

2-7

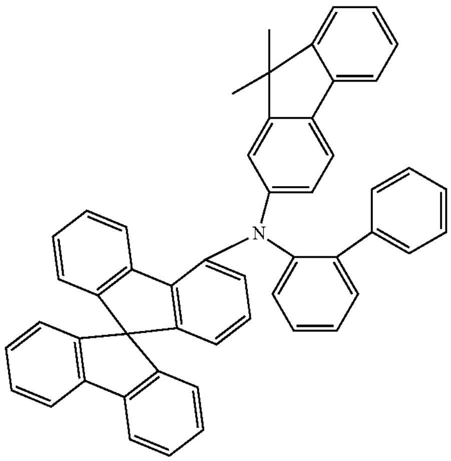

2-8

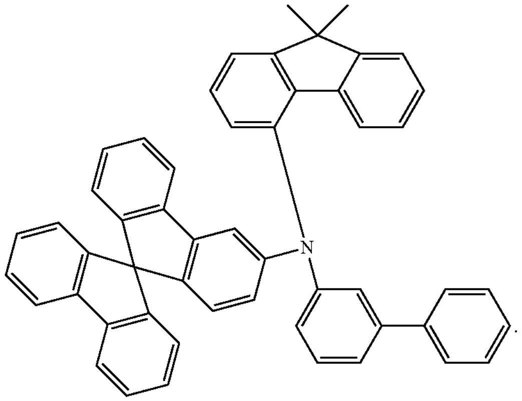

The p-type dopant 394 satisfying the relationship of Formula A may include an organic compound having LUMO energy level between about −4.0 eV and about −5.0 eV, for example, about −4.5 eV and about −5.0 eV. In one aspect, the P-type dopant 394 may comprise, but is not limited to, an organic compound having a radialene core, a quinone core or an indacene core. As an example, the P-type dopant 394 having the indacene core may include an organic compound having the following structure of Formula 5:

Formula 5

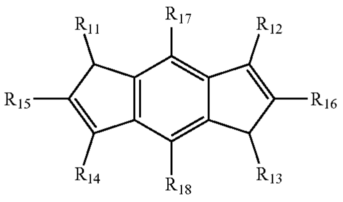

wherein $R_{11}$ is a group of an exocyclic double bond having the following structure of Formula 6; one of $R_{12}$ and $R_{13}$ is identical to Ru and the other of $R_{12}$ and $R_{13}$ is identical to $R_{14}$; each of $R_{14}$ to $R_{16}$ is independently a halogen atom, a $C_1$-$C_{10}$ alkyl group substituted with at least one halogen atom, a $C_1$-$C_{10}$ alkoxy group substituted with at least one halogen atom, a $C_1$-$C_{10}$ alkyl silyl group substituted with at least one halogen atom, a cyano group, a nitro group, a $C_6$-$C_{30}$ aryl group or a $C_3$-$C_{30}$ hetero aryl group, wherein each of the aryl group and the hetero aryl group may be independently substituted with at least one of a halogen atom, a $C_1$-$C_{10}$ alkyl group substituted with at least one of halogen atom, a $C_1$-$C_{10}$ alkoxy group substituted with at least one halogen atom, a $C_1$-$C_{10}$ alkyl silyl group substituted with at least one halogen atom, a cyano group and a nitro group; each of $R_{17}$ and $R_{18}$ is independently protium, deuterium, a $C_1$-$C_{10}$ alkyl group or a $C_1$-$C_{10}$ alkoxy group.

Formula 6

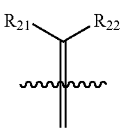

wherein each of $R_{21}$ and $R_{22}$ is independently a halogen atom, a $C_1$-$C_{10}$ alkyl group substituted with at least one halogen atom, a $C_1$-$C_{10}$ alkoxy group substituted with at least one halogen atom, a $C_1$-$C_{10}$ alkyl silyl group substituted with at least one halogen atom, a cyano group, a nitro group, a $C_6$-$C_{30}$ aryl group or a $C_3$-$C_{30}$ hetero aryl group, wherein each of the aryl group and the hetero aryl group may be independently substituted with at least one of a halogen atom, a $C_1$-$C_{10}$ alkyl group substituted with at least one of halogen atom, a $C_1$-$C_{10}$ alkoxy group substituted with at least one halogen atom, a $C_1$-$C_{10}$ alkyl silyl group substituted with at least one halogen atom, a cyano group and a nitro group.

In one aspect, the organic compound having the indacene core of Formula 5 may be selected from, but is not limited to, the following organic compounds of Formula 7:

Formula 7

3-1

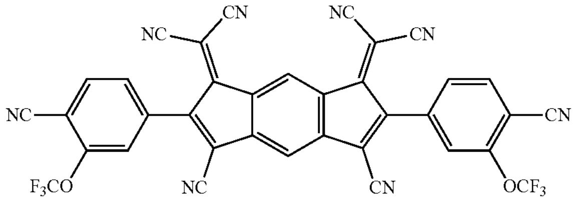

3-2

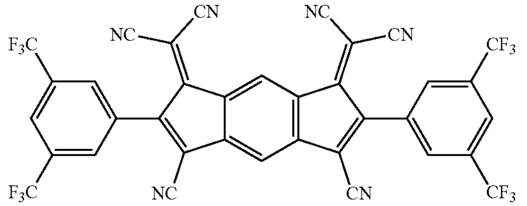

3-3

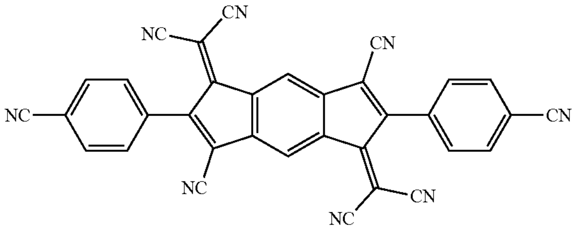

3-4

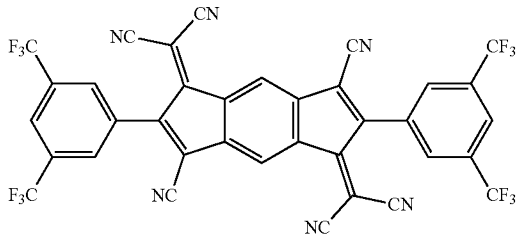

3-5

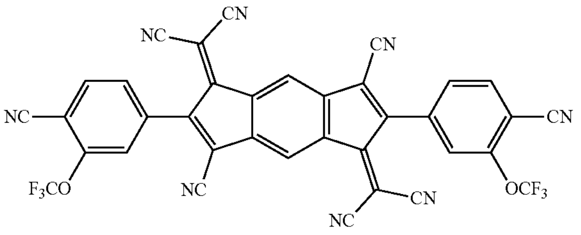

3-6

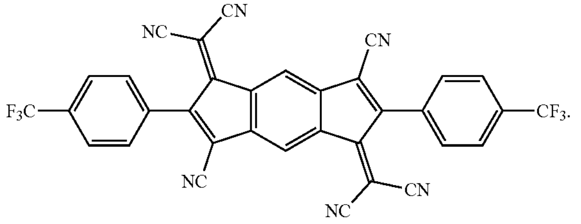

In one aspect, the contents the P-type dopant 394 in the P-CGL 390 may be between about 3 wt % and about 30 wt %, for example, about 5 wt % and about 20 wt %. When the contents of the P-type dopant 394 in the P-CGL 390 is less than about 3 wt %, the hole generation in the P-CGL 390 as well as the hole transport and hole injection into the EML2 440 from the P-CGL 390 may not be sufficient. In contrast, when the contents of the P-type dopant 394 in the P-CGL 390 is more than about 30 wt %, the P-CGL 390 generates excessive holes, which causes the EML2 440 to decrease its luminous efficiency (roll-off) as the excessive holes are injected into the EML2 440 without recombining with electrons. For example, the contents of the P-type dopant 394 in the P-CGL 390 may be about 5 times to about 60 times, for example, about 5 times to about 20 times as the contents of the N-type dopant 384 in the N-CGL 380.

The N-CGL 380 may be an organic layer including the N-type host 382 and the N-type dopant 384. For example, the N-type host 382 may comprise, but is not limited to, an organic metal compound having a hydroxy-quinoline ligand such as $Alq_3$, a triazine-based compound, a benzazole-based compound, a xylol-based compound, Bphen and MTDATA.

In one aspect, the N-type dopant 384 may comprise an alkali metal such as Li, Na, K and Cs and/or an alkaline earth metal such as Mg, Sr, Ba and Ra. Alternatively, the N-type dopant 384 may comprise, but is not limited to, an compound including an anion (hpp) of 1,3,4,6,7,8-hexahydro-2H-pyrimido[1,2-a]pyrimidine (e.g., $Cr_2hpp_4$, $Fe_2hpp_4$, $Mnr_2hpp_4$, $Co_2hpp_4$, $Mo_2hpp_4$, $W_2hpp_4$, $Ni_2hpp_4$, $Cu_2hpp_4$, $Zn_2hpp_4$, $W(hpp)_4$) and/or an imidazole-based compound such as 4,4',5,5'-tetracyclohexyl-1,1',2,2',3,3'-hexamethyl-2,2',3,3'-tetrahydro-1H,1'H-2,2'-biimidazole, 2,2'-diisopropyl-1,1',3,3'-tetramethyl-2,2',3,3',4,4',5,5',6,6',7,7'-dodecahydro-1H,1'H-2,2'-bibenzo[d]imidazole, 2,2'-diisopropyl-4,4',5,5'-tetrakis(4-methoxyphenyl)-1,1',3,3'-tetramethyl-2,2',3,3'-tetrahydro-1H,1'H-2,2'-biimidazole, 2,2'-diisopropyl-4,5-bis (2-methoxyphenyl)-4',5'-bis(4-methoxyphenyl)-1,1',3,3'-tetramethyl-2,2',3,3'-tetrahydro-1H,1'H-2,2'-biimidazole, 2,2'-diisopropyl-4,5-bis(2-methoxyphenyl)-4',5'-bis(3-methoxyphenyl)-1,1',3,3'-tetramethyl-2,2',3,3'-tetrahydro-1H,1'H-2,2'-biimidazole.

In one aspect, the contents of the N-type dopant 384 in the N-CGL 380 may be between about 0.1 wt % and about 5 wt %, for example, about 0.5 wt % and about 3 wt %. when the contents of the N-type dopant 384 in the N-CGL 380 is less than about 0.1 wt %, the electron generation in the N-CGL 380 as well as the electron transport and electron injection into the first emitting part 300 from the N-CGL 380 may not be sufficient. In contrast, when the contents of the N-type dopant 384 in the N-CGL 380 is more than about 5 wt %, excessive electrons are injected into the first emitting part 300 so that current leakage may be occurred or driving voltage of the OLED D1 may be raised.

Figure 6:
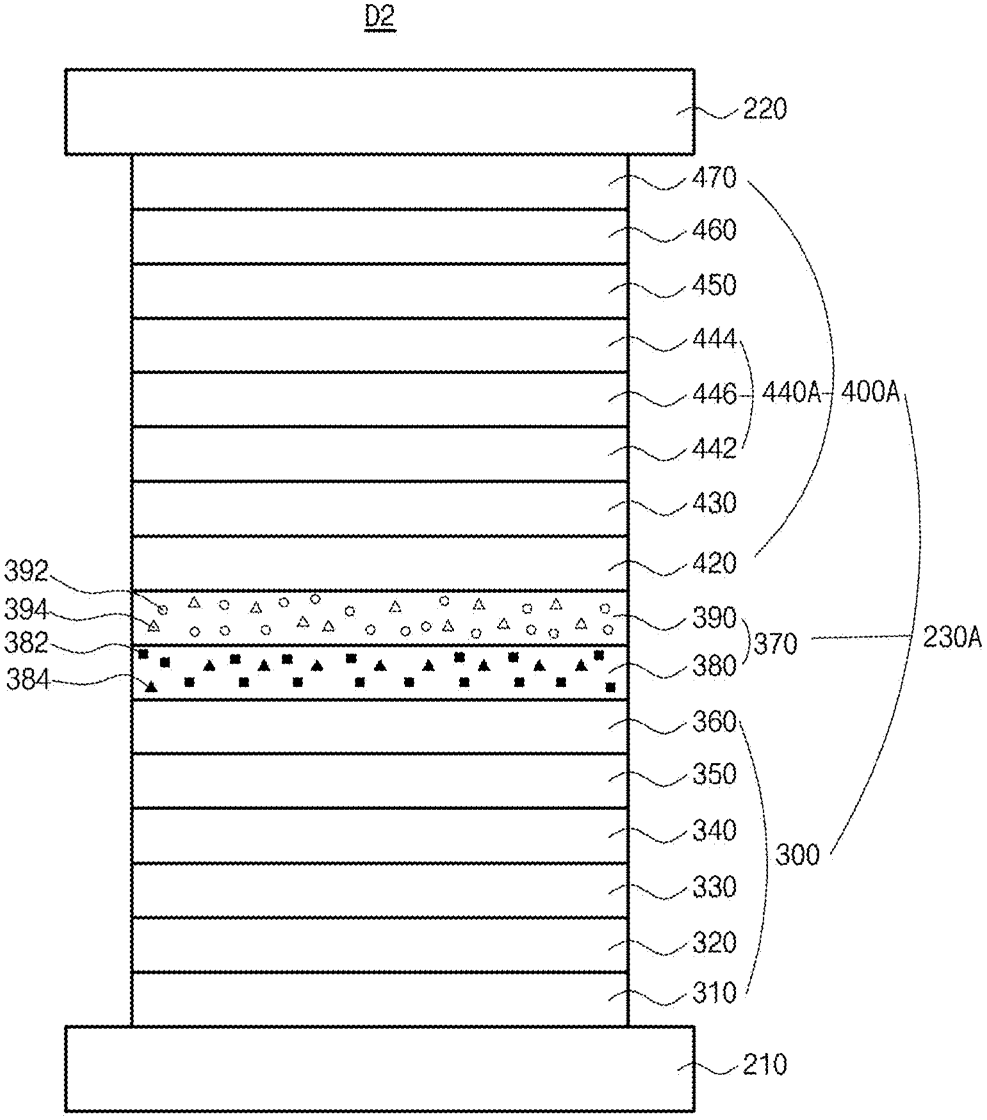
FIG. 6 is a cross-sectional view illustrating an organic light emitting diode having two emitting parts in accordance with another aspect of the present disclosure.

In the above, while the EML2 440 emits green and red light, the EML2 440 may further comprise other emitting material layer. FIG. 6 is a cross-sectional view illustrating an organic light emitting diode having two emitting parts in accordance with another aspect of the present disclosure.

As illustrated in FIG. 6, an organic light emitting diode (OLED) D2 in accordance with the second aspect of the present disclosure includes first and second electrodes 210 and 220 facing each other and an emissive layer 230A disposed between the first and second electrodes 210 and 220. The emissive layer 230A includes a first emitting part 300 disposed between the first and second electrodes 210 and 220, a second emitting part 400A disposed between the first emitting part 300 and the second electrode 220 and a CGL 370 disposed between the first and second emitting parts 300 and 400A.

The first emitting part 300 includes an EML1 340. The first emitting part 300 may further include at least one of an HIL 310 and an HTL1 320 disposed sequentially between the first electrode and the EML1 340 and an ETL1 360 disposed between the EML1 340 and the CGL 370. Alternatively, the first emitting part 300 may further comprise an EBL1 330 disposed between the HTL1 320 and the EML1 340 and/or an HBL1 350 disposed between the EML1 340 and the ETL1 360.

The second emitting part 400A includes an EML2 440A. The second emitting part 400A may further include at least one of an HTL2 420 disposed between the CGL 370 and the EML2 440A and an ETL2 460 and an EIL 470 disposed sequentially between the EML2 440A and the second electrode 220. Alternatively, the second emitting part 400A may further comprise an EBL2 430 disposed between the HTL2 420 and the EML2 440A and/or an HBL2 450 disposed between the EML2 440A and the ETL2 460. The configurations other than the EML2 440A in the emissive layer 230A may be substantially identical to those in the emissive layer 230 as described above.

In this aspect, the EML1 340 may emit blue light and may comprise blue (B) host and blue (B) dopant. The EML2 440A may include a red (R) emitting material layer 442, a yellow green (YG) or yellow (Y) emitting material layer 446 and a green emitting material layer 444 each of which is disposed sequentially between the EBL2 430 and the HBL2 450. The red (R) emitting material layer 442 includes red (R) host and red (R) dopant, the green (G) emitting material layer 444 includes green host and green dopant. Each of the blue (B)/red (R)/green (G) host and the blue (B)/red (R)/green (G) dopant may be identical to that described above, respectively.

The yellow green (YG) or yellow (Y) emitting material layer 446 may include yellow green (YG) or yellow (Y) host and yellow green (YG) or yellow (Y) dopant. The yellow green (YG) or yellow (Y) host may comprise, but is not limited to, BCzPh, CBP, TCP, TCTA, CDBP, DMFL-CBP, Spiro-CBP, DPEPO, PCzB-2CN, mCzB-2CN, TCz1, $Bebq_2$, TPB3, BAlq and combination thereof, The yellow green (YG) or yellow (Y) dopant may comprise at least one of yellow green (YG) or yellow (Y) phosphorescent material, yellow green (YG) or yellow (Y) fluorescent material and yellow green (YG) or yellow (Y) delayed fluorescent material. For example, the yellow green (YG) or yellow (Y) dopant may comprise, but is not limited to, 5,6,11,12-Tetraphenylnaphthalene (Rubrene), 2,8-Di-tert-butyl-5,11-bis(4-tert-butylphenyl)-6,12-diphenyltetracene (TBRb), Bis(2-phenylbenzothiazolato)(acetylacetonate)iridium(III) ($Ir(BT)_2(acac)$), Bis(2-(9,9-diethytl-fluoren-2-yl)-1-phenyl-1H-benzo[d]imdiazolato)(acetylacetonate)iridium(III) ($Ir(fbi)_2(acac)$), Bis(2-phenylpyridine)(3-(pyridine-2-yl)-2H-chromen-2-onate)iridium(III) (fac-$Ir(ppy)_2Pc$), Bis(2-(2,4-difluorophenyl)quinoline)(picolinate)iridium(III) (FPQIrpic) and combination thereof.

Figure 5:
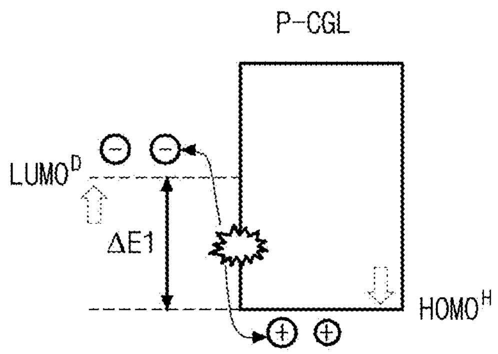
FIG. 5 is a schematic diagram illustrating relative energy levels and energy bandgap between host and dopant in one P-type charge generation layer providing holes to green emitting material layer.

In this aspect, the HOMO energy level $HOMO^H$ of the P-type host 392 and the LUMO energy level LUMOD of the P-type dopant 394 in the P-CGL 390 may satisfy the relationship of Formula A (see, FIG. 5). For example, the P-type host 392 may comprise, but is not limited to, the anthracene-based compound having the Formulae 1 and 2 and/or the spirofluorene-based compound having the Formulae 3 and 4. Also, the P-type dopant 394 may comprise, but is not limited to, the organic compound with at least one exocyclic double bond to the indacene core having the structure of Formulae 5 to 6.

The P-CGL has controlled energy bandgap ΔE1 between the HOMO energy level $HOMO^H$ of the P-type host 392 and the LUMO energy level $LUMO^D$ of the P-type dopant 394 so that the contents of the green light of the light emitted from the EML2 440A can be maintained irrespective of the gradation and current density. Therefore, the white light emitting from the OLED D2 has constant value, e.g., the chromaticity of Y-axis larger than the chromaticity of X-axis in the CIE chromaticity distribution irrespective of the gradation. In other words, since white light having a constant chromaticity without chromaticity inversion by gradation or current density is emitted from the OLED D2, efficient optical compensation can be performed.

Figure 7:
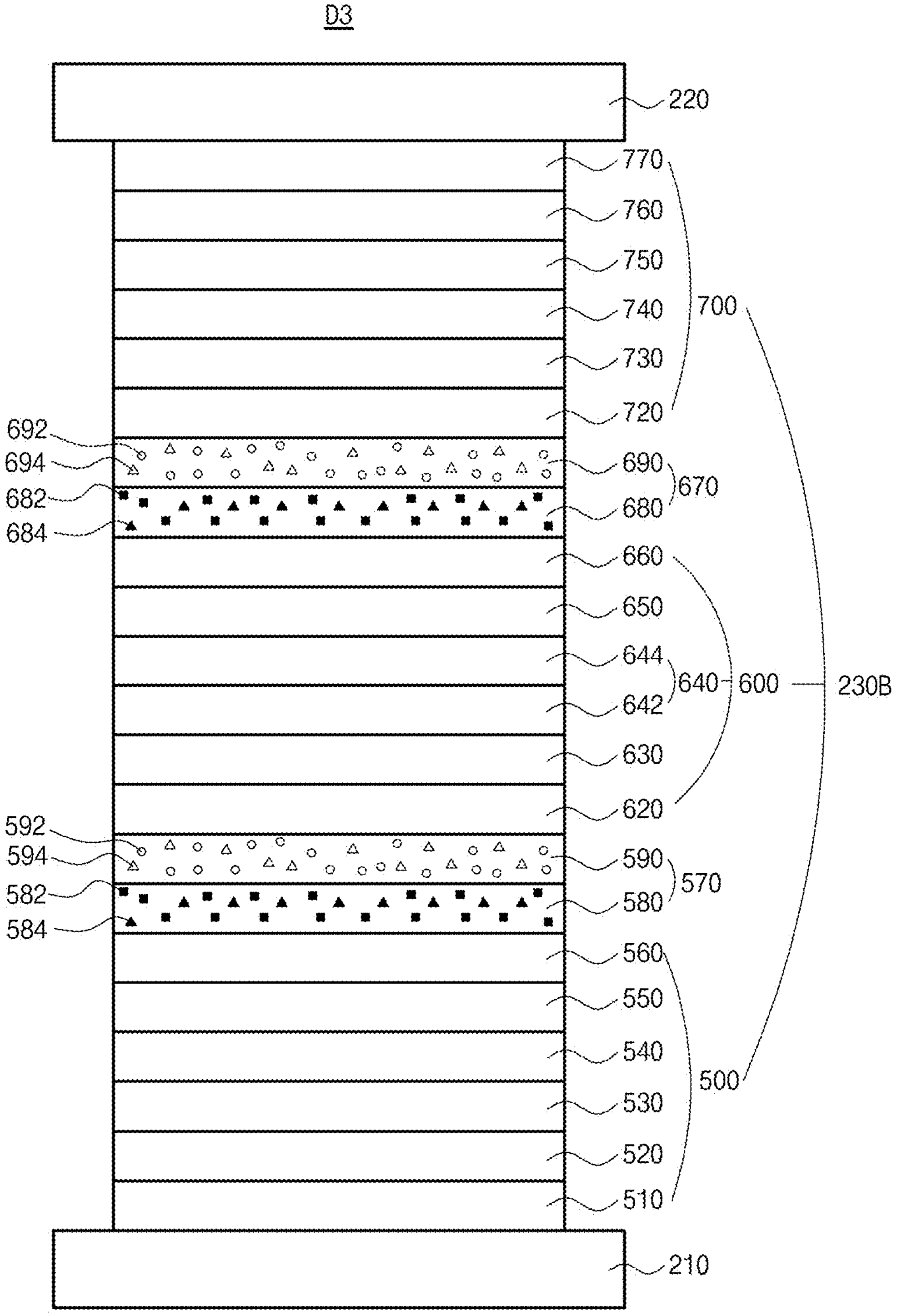
FIG. 7 is a cross-sectional view illustrating an organic light emitting diode having three emitting parts in accordance with still another aspect of the present disclosure.

In the above first and second aspect, the OLED has two emitting parts to form a tandem structure. Unlikely, an organic light emitting diode may have three or more emitting parts to form a tandem structure. FIG. 7 is a cross-sectional view illustrating an organic light emitting diode having three emitting parts in accordance with still another aspect of the present disclosure.

As illustrated in FIG. 7, an organic light emitting diode (OLED) D3 in accordance with this aspect includes first and second electrodes 210 and 220 facing each other and an emissive layer 230B disposed between the first and second electrodes 210 and 220. The emissive layer 230B includes a first emitting part 500 disposed between the first and second electrodes 210 and 220, a second emitting part 600 disposed between the first emitting part 500 and the second electrode 220, a third emitting part 700 disposed between the second emitting part 600 and the second electrode, a first charge generation layer (CGL1) 570 disposed between the first and second emitting parts 500 and 600, and a second charge general layer (CGL2) 670 between the second and third emitting parts 600 and 700.

The first emitting part 500 includes an EML1 540. The first emitting part 500 may further include at least one of an HIL 510 and an HTL1 520 disposed sequentially between the first electrode and the EML1 540 and an ETL1 560 disposed between the EML1 540 and the CGL1 570. Alternatively, the first emitting part 500 may further comprise at least one of an EBL1 530 disposed between the HTL1 520 and the EML1 540 and an HBL1 550 disposed between the EML1 540 and the ETL1 560.

The second emitting part 600 includes an EML2 640. The second emitting part 600 may further include at least one of an HTL2 620 disposed between the CGL1 570 and the EML2 640 and an ETL2 660 disposed between the EML2 640 and the CGL2 670. Alternatively, the second emitting part 600 may further comprise at least one of an EBL2 630 disposed between the HTL2 620 and the EML2 640 and an HBL2 650 disposed between the EML2 640 and the ETL2 660.

The third emitting part 700 includes a third emitting material layer (EML3) 740. The third emitting part 700 may further includes at least one of a third hole transport layer (HTL3) 720 disposed between the CGL2 670 and the EML3 740 and a third electron transport layer (ETL3) 760 and an EIL 770 disposed sequentially between the EML3 740 and the second electrode 220. Alternatively, the third emitting part 700 may further comprise a third electron blocking layer (EBL3) 730 disposed between the HTL3 720 and the EML3 740 and/or a third hole blocking layer (HBL3) 750 disposed between the EML3 740 and the ETL3 760.

In one aspect, each of the EML1 540 and the EML3 740 may be a blue (B) emitting material layer, respectively, and the EML2 640 may any emitting material layer that emits light with photoluminescence wavelength longer than the light emitted from the blue emitting material layer, so that the OLED D3 can realize white light. Each of the EML1 540, the EML2 640 and the EML3 740 may include host and dopant, respectively. As an example, the contents of the dopant in each of the EML1 540, the EML2 640 and the EML3 740 may be, but is not limited to, between about 1 wt % and about 50 wt %, for example, about 1 wt % and about 30 wt %, respectively.

The HIL 510 is disposed between the first electrode 210 and the HTL1 520 and improves an interface property between the inorganic first electrode 210 and the organic HTL1 520. As an example, the HIL 510 may include, but is not limited to, MTDATA, NTA, 1T-NATA, 2T-NATA, CuPc, TCTA, NPB (NPD), HAT-CN, TDAPB, PEDOT/PSS, F4-TCNQ, N-(biphenyl-4-yl)-9,9-dimethyl-N-(4-(9-phenyl-9H-carbazol-3-yl)phenyl)-9H-fluoren-2-amine and combination thereof. The HIL 510 may be omitted in compliance of the OLED D3 property.

The HTL1 520 is disposed between the HIL 510 and the EML1 540, the HTL2 620 is disposed between the CGL1 570 and the EML2 640 and the HTL3 720 is disposed between the CGL2 670 and the EML3 740. As an example, each of the HTL1 520, the HTL2 620 and the HTL3 720 may independently include, but is not limited to, TPD, NPB (NPB), DNTPD, CBP, poly-TPD, TFB, TAPC, DCDPA, N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-Biphenyl]-4-yl)-9,9-dimethyl-N-(4-(9-phenl-9H-carbazol-3-yl)phenyl)-9H-fluoren-2-amine, N4,N4,N4',N4'-tetrakis([1,1'-biphenyl]-4-yl)-[1,1'-biphenyl]-4,4'-diamine and combination thereof, respectively.

Each of the ETL1 560, the ETL2 660 and the ETL3 760 provides electrons each of the EML1 540, the EML2 640 and the EML3 740, respectively. For example, each of the ETL1 560, the ETL2 660 and the ETL3 760 may comprise independently, but is not limited to, any one of oxadiazole-based compounds, triazole-based compounds, phenanthroline-based compounds, benzoxazole-based compounds, benzothiazole-based compounds, benzimidazole-based compounds, triazine-based compounds, and the like, respectively. More particularly, each of the ETL1 560, the ETL2 660 and the ETL3 760 may comprise independently, but is not limited to, $Alq_3$, PBD, spiro-PBD, Liq, TPBi, BAlq, Bphen, NBphen, BCP, TAZ, NTAZ, TpPyPB, TmPyPB, TmPPPyTz, PFNBr, TPQ, TSPO1, ZADN and combination thereof.

The EIL 770 is disposed between the ETL3 760 and the second electrode 220, and can improve physical properties of the second electrode 220 and therefore, can enhance the luminous lifespan of the OLED D3. In one aspect, the EIL 770 may comprise, but is not limited to, an alkali metal halide or an alkaline earth metal halide such as LiF, CsF, NaF, $BaF_2$ and the like, and/or an organic metal compound such as Liq, lithium benzoate, sodium stearate, and the like. The EIL 770 may be omitted in accordance with the OLED D3 structure.

Each of the EBL1 530, the EBL2 630 and the EBL3 730 controls electron transport between the HTL1 520, the HTL2 620 and the HTL3 720 and the EML1 540, the EML2 640 and the EML3 740, respectively. As an example, each of the EBL1 530, the EBL2 630 and the EBL3 730 may comprise independently, but is not limited to, TCTA, Tris [4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, DNTPD, TDAPB, DCDPA, 2,8-bis(9-phenyl-9H-carbazol-3-yl)dibenzo([b,d]thiophene and combination thereof, respectively.

Each of the HBL1 550, the HBL2 650 and the HBL3 750 controls hole transport between the EML1 540, the EML2 640 and the EML3 740 and the ETL1 560, the ETL2 660 and the ETL3 760, respectively. Each of the HBL1 550, the HBL2 650 may comprise independently, but is not limited to, any one of oxadiazole-based compounds, triazole-based compounds, phenanthroline-based compounds, benzoxazole-based compounds, benzothiazole-based compounds, benzimidazole-based compounds, and triazine-based compounds and the likes each of which can be used in each of the ETL1 560, the ETL2 660 and the ETL3 760, respectively.

For example, each of the HBL1 550, the HBL2 650 and the HBL3 750 may comprise independently, but is not limited to, $Alq_3$, BAlq, Liq, PBD, spiro-PBD, BCP, TSPO1, Bis-4,5-(3,5-di-3-pyridylphenyl)-2-methylpyrimidine (B3PYMPM), DPEPO, 9-(6-(9H-carbazol-9-yl)pyridine-3-yl)-9H-3,9'-bicarbazole and combination thereof, respectively.

As described above, each of the EML1 540 and the EML3 740 may be a blue (B) emitting material layer, respectively. For example, each of the EML1 540 and the EML3 740 may comprise independently one of a blue emitting material layer, a dark blue emitting material layer and a sky blue emitting material layer. In this case, each of the EML1 540 and the EML3 740 may emit light with a photoluminescence peak between about 440 nm and about 480 nm.

Each of the EML1 540 and the EML3 740 may comprise blue (B) host and blue (B) dopant, respectively. As an example, the blue (B) host may include, but is not limited to, mCP, mCP-CN, mCBP, CBP-CN, mCPPO1, Ph-mCP, TSPO1, CzBPCb, UGH-1, UGH-2, UGH-3, SPPO1, SimCP, 2-AND and combination thereof. The blue (B) dopant may comprise at least one of blue phosphorescent material, blue fluorescent material and blue delayed fluorescent material. For example, the blue (B) dopant may comprise, but is not limited to, perylene, DPAVBi, DPAVB, BDAVBi, spiro-DPVBi, DSB, DSA, TBPe, $Beep_2$, PCAN, 1,6-Bi s(diphenylamine)pyrene, mer-Ir($pmi)_3$), fac-$Ir(dpbic)_3$, $Ir(tfpd)_2pic$, $Ir(Fppy)_3$, FIrpic and combination thereof.

The EML2 640 may emit light of photoluminescence peak longer than the blue light emitted from each of the first and third EMLs 540 and 740 and may comprise a green (G) emitting material layer. As an example, the EML2 640 include a red (R) emitting material layer 642 disposed between the EBL2 630 and the HBL2 650 and the green (G) emitting material layer 644 so that the EML2 640 may emit red-green light. When the EML2 640 emits red-green light, the EML2 640 may emit light with wavelength between about 510 nm and about 650 nm.

The red (R) emitting material layer 642 may include red (R) host and red (R) dopant. For example, the red (R) host may comprise, but is not limited to, BCzPh, CBP, TCP, TCTA, CDBP, DMFL-CBP, spiro-CBP, DPEPO, PCzB-2CN, mCzB-2CN, TCz1, $Bepp_2$, $Bebq_2$, TBP3 and combination thereof.

The red (R) dopant may comprise at least one of red phosphorescent material, red fluorescent material and red delayed fluorescent material. For example, the red (R) dopant may comprise, but is not limited to, Ir(($piq)_3$, [Bis (2-(4,6-dimethyl)phenylquinoline)](2,2,6,6-tetramethylheptane-3,5-dionate)iridium (III), Hex-$Ir(phq)_2(acac)$, Hex-Ir$(phq)_3$, $Ir(Mphq)_3$, $Ir(dpm)PQ_2$, $Ir(dpm)(piq)_2$, Hex-$Ir(piq)_2(acac)$, Hex-$Ir(piq)_3$, $Ir(dmpq)_3$, $Ir(dmpq)_2(acac)$, $Ir(mphmq)_2(acac)$, $Eu(dbm)_3(phen)$ and combination thereof.

The green (G) emitting material layer 644 may comprise green (G) host and green (G) dopant. For example, the green (G) host may comprise, but is not limited to, BCzPh, CBP, TCP, TCTA, CDBP, DMFL-CBP, Spiro-CBP, DPEPO, PCzB-2CN, mCzB-2CN, TCz1 and combination thereof. The green (G) dopant may comprise at least one of green phosphorescent material, green fluorescent material and green delayed fluorescent material For example, the green (G) dopant may comprise, but is not limited to, [Bis(2-phenylpyridine)](pyridyl-2-benzofuro[2,3-b]pyridine) iridium, $Ir(ppy)_3$, fac-$Ir(ppy)_3$, $Ir(ppy)_2(acac)$, $Ir(mppy)_3$, $Ir(npy)_2acac$, $Ir(3mppy)_3$, TEG, $Alq_3$ and combination thereof.

The CGL1 570 is disposed between the first emitting part 500 and the second emitting part 600 and the CGL2 670 is disposed between the second emitting part 600 and the third emitting part 700. Each of the CGL1 570 and the CGL2 670 generates charges and controls charge injection balance between the first emitting part 500 and the second emitting part 600, and the second emitting part 600 and the third emitting part 700, respectively.

The CGL1 570 includes a first N-type CGL (N-CGL1) 580 disposed adjacently to the first emitting part 500 and a first P-type CGL (P-CGL1) 590 disposed adjacently to the second emitting part 600. The CGL2 670 includes a second N-type CGL (N-CGL2) 680 disposed adjacently to the second emitting part 600 and a second P-type CGL (P-CGL2) 690 disposed adjacently to the third emitting part 700.

Each of the N-CGL1 580 and the N-CGL2 680 provides electrons into the first emitting part 500 and the second emitting part 600, respectively, and each of the P-CGL1 590 and the P-CGL2 690 provides holes into the second emitting part 600 and the third emitting part 700, respectively. The N-CGL1 580 may include a first N-type host 582 and a first N-type dopant 584 and the N-CGL2 680 may include a second N-type host 682 and a second N-type dopant 684. The P-CGL1 590 may include a first P-type host 592 and a first P-type dopant 594 and the P-CGL2 690 may include a second P-type host 692 and a second P-type dopant 694.

The first P-type host 592 in the P-CGL1 590 is designed to have a deep HOMO energy level and the first P-type dopant 594 in the P-CGL1 590 is designed to have a shallow LUMO energy level. For example, an energy bandgap ΔE1 between the HOMO energy level $HOMO^H$ of the first P-type host 592 and the LUMO energy level $LUMO^D$ of the first P-type dopant 594 may satisfy the relationship of Formula A above (see, FIG. 5).

As described above, when the energy bandgap ΔE1 between the HOMO energy level $HOMO^H$ of the first P-type host 592 and the LUMO energy level $LUMO^D$ of the first P-type dopant 594 satisfies the relationship of Formula A, holes and electrons can be injected in balance into the green (G) emitting material layer 644, and the roll-off in the green emitting material layer 644 can be reduced or minimized.

Accordingly, in case of introducing the first P-type host 592 and the first P-type dopant 594 satisfying the relationship of Formula A into the P-CGL1 590, the amount of green light among the light emitted from the EML2 640 can be maintained constantly irrespective of the gradation or the current density, and thus the white light emitted from the OLED D3 can keep constant values, e.g., the chromaticity of Y-axis is larger than the chromaticity of X-axis in the CIE chromaticity distribution irrespective of the gradation or the current density.

If only the X-axis chromaticity is compensated for the white light having a constant chromaticity regardless of gradation, efficient white balance can be realized in both the low gradation section and the high gradation section. Since white light having the constant chromaticity without chromaticity conversion by the gradation or current density is emitted from the OLED D3, efficient optical compensation can be performed.

For example, the first P-type host 592 satisfying the relationship of Formula A may include an organic compound having HOMO energy level between about −5.0 eV and about −6.0 eV, for example, about −5.2 eV and about −5.5 eV. As an example, the first P-type host 592 may include, but is not limited to, the anthracene-based compound having the structure of Formulae 1 to 2 and/or the spirofluorene-based compound having the structure of Formulae 3 to 4.

The first P-type dopant 594 satisfying the relationship of Formula A may include an organic compound having LUMO energy level between about −4.0 eV and about −5.0 eV, for example, about −4.5 eV and about −5.0 eV. As an example, the first P-type dopant 594 may comprise, but is not limited to, the organic compound with at least one exocyclic double bond to the indacene core having the structure of Formulae 5 to 6.

In one aspect, the contents the first P-type dopant 594 in the P-CGL1 590 may be between about 3 wt % and about 30 wt %, for example, about 5 wt % and about 20 wt %. For example, the contents of the first P-type dopant 594 in the P-CGL1 590 may be about 5 times to about 60 times, for example, about 5 times to about 20 times as the contents of the first N-type dopant 584 in the N-CGL1 580.

Figure 8:
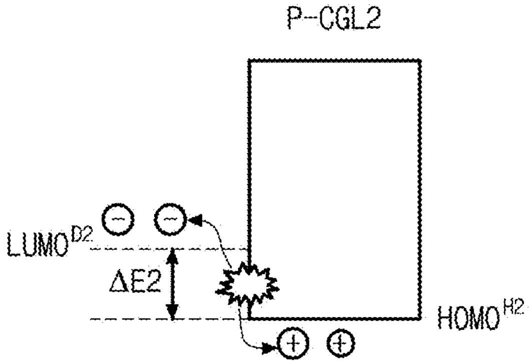
FIG. 8 is a schematic diagram illustrating relative energy levels and energy bandgap between host and dopant in another P-type charge generation layer providing holes to blue emitting material layer.

Unlikely to the P-CGL1 590, in some embodiments, the P-CGL2 690 needs to generate holes efficiently and inject holes rapidly into the EML3 740 of the blue (B) emitting material layer. Referring to FIG. 8, an energy bandgap ΔE2 between a HOMO energy level HOMO' of the second P-type host 692 and a LUMO energy level $LUMO^{D2}$ of the second P-type dopant 694 is reduced or minimized. Accordingly, the second P-type dopant 694 accepts electrons from the HOMO energy level of the second P-type host 692 or the hole transport material in the HTL3 720 to its LUMO energy level so that hole transport path for transporting holes from the P-CGL2 690 to the EML3 740 can be formed.

In other words, the energy bandgap ΔE1 between the HOMO energy level $HOMO^H$ of the first P-type host 592 and the LUMO energy level $LUMO^D$ of the first P-type dopant 594 in the P-CGL1 590 (see, FIG. 5) is different form the energy bandgap ΔE2 between the HOMO energy level HOMO' of the second P-type host 692 and the LUMO energy level $LUMO^{D2}$ of the second P-type dopant 694 in the P-CGL2 690. The energy bandgap ΔE1 between the HOMO energy level $HOMO^H$ of the first P-type host 592 and the LUMO energy level $LUMO^D$ of the first P-type dopant 594 in the P-CGL1 590 may be larger than the energy bandgap ΔE2 between the HOMO energy level $HOMO^{H2}$ of the second P-type host 692 and the LUMO energy level $LUMO^{D2}$ of the second P-type dopant 694 in the P-CGL2 690. For example, the energy bandgap ΔE2 between the HOMO energy level $HOMO^{H2}$ of the second P-type host 692 and the LUMO energy level $LUMO^{D2}$ of the second P-type dopant 694 in the P-CGL2 690 may satisfy a relationship of the following Formula B:

$$0.35\ \text{eV} \leq LUMO^{D2} - HOMO^{H2} \leq 0.5\ \text{eV}. \quad \text{Formula B:}$$

In one aspect, the energy bandgap ΔE2 between the HOMO energy level $HOMO^{H2}$ of the second P-type host 692 and the LUMO energy level $LUMO^{D2}$ of the second P-type dopant 694 in the P-CGL2 690 may be between about 0.05 eV and about 0.20 eV. For example, the second P-type host 692 satisfying the relationship of Formula B may include an organic compound having HOMO energy level between about −5.0 eV and about −6.0 eV, for example, about −5.0 eV and about −5.3 eV. As an example, the second P-type host 692 may include, but is not limited to, a spirofluorene-based compound having the following structure of Formula 8:

Formula 8

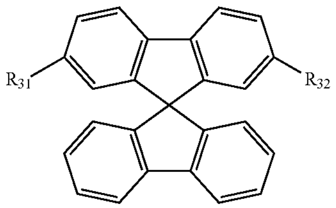

wherein each of $R_{31}$ and $R_{32}$ is independently protium, deuterium, a carbazolyl group or

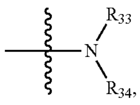

wherein at least one of $R_{31}$ and $R_{32}$ is a carbazolyl group or

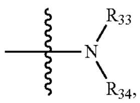

each of $R_{33}$ and $R_{34}$ is independently a $C_6$-$C_{30}$ aryl group or a $C_3$-$C_{30}$ hetero aryl group, and wherein each of the carbazolyl group, the aryl group and the hetero aryl group may be independently unsubstituted or substituted with at least one $C_1$-$C_{10}$ alkyl group, and at least one of $R_{33}$ and $R_{34}$ may be a poly-cyclic aryl group or a poly-cyclic hetero aryl group.

For example, one of $R_{33}$ and $R_{34}$ in Formula 8 may comprise phenyl, biphenyl, naphthyl and anthracenyl and the other of $R_{33}$ and $R_{34}$ may comprise fluorenyl unsubstituted or substituted with a $C_1$-$C_{10}$ alkyl group, but is not limited thereto. As an example, the spirofluorene-based compound having the structure of Formula 8 may be selected from, but is not limited to, the following organic compounds of Formula 9:

Formula 9

4-1

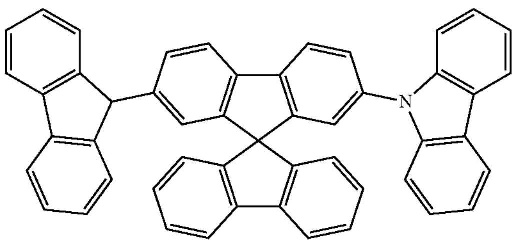

-continued 4-2

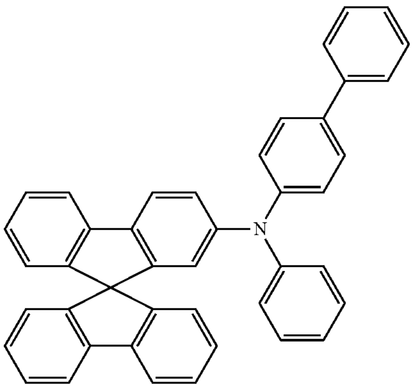

4-3

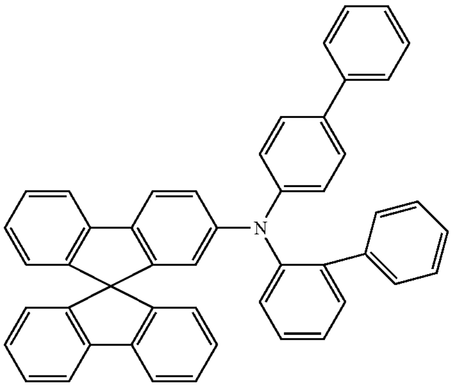

4-4

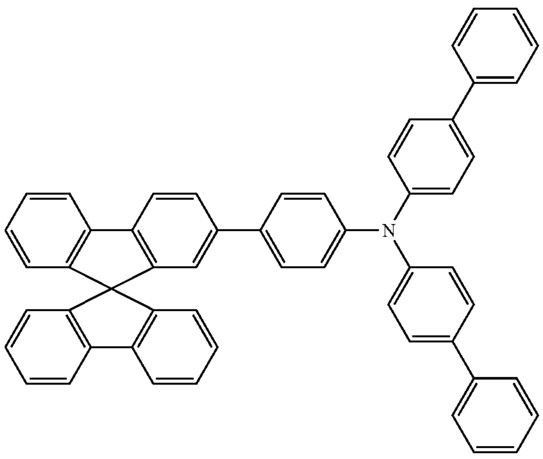

-continued 4-5

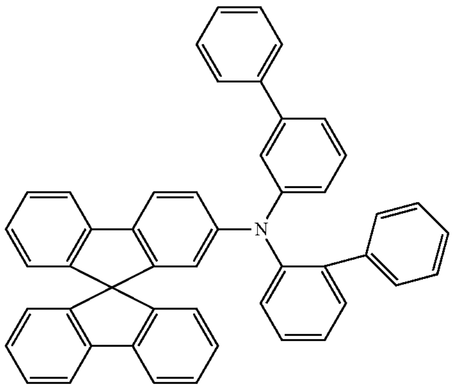

The second P-type dopant 694 satisfying the relationship of Formula B may include an organic compound having LUMO energy level between about −5.0 eV and about −5.5 eV, for example, about −5.0 eV and about −5.2 eV. For example, the second P-type dopant 694 may have a radialene structure or comprise an aromatic compound and a hetero aromatic compound each of which is substituted with at least one strong electron-withdrawing group such as a cyano group, a halogen atom (e.g., F, Cl and/or Br), a $C_1$-$C_{10}$ halo alkyl group such as $CF_3$ and/or a nitro group.

For example, the second P-type dopant 694 may comprise, but is not limited to, HAT-CN, F4-TCNQ, 7,7,8,8-Tetracyanoquinodimethane (F6-TCNQ), hexacyano-trimethylene-cyclopropane (CN6-CP), 2,2-(perfluoronaphthalene-2,6-diylidene)-dimalononitrile (F6-TCNNQ), 2,2'-(2,5-dibromo-3,6-difluorocyclohexa-2,5-diene-1,4-diylidene)dimalonitrile, (2E,2'E,2"E)-2,2',2"-(cyclopropane-1,2,3-triylidene)tris(2-(perfluorophenyl)-acetonitrile), (2E,2'E,2"E)-2,2',2"-(cyclopropane-1,2,3-triylidene)tris(2-(perfluoropyridin-4-yl)-acetonitrile), (2E,2'E,2"E)-2,2',2"-(cyclopropane-1,2,3-triylidene)tris(2-(4-cyanoperfluorophenyl)-acetonitrile), (2E,2'E,2"E)-2,2',2"-(cyclopropane-1,2,3-triylidene)tris(2-(2,3,5,6-tetrafluoro-4-(trifluoromethyl)phenyl)-acetonitrile), (2E,2'E,2"E)-2,2',2"-(cyclopropane-1,2,3-triylidene)tris(2-(2,6-dichloro-3,5-difluoro-4-(trifluoromethyl)phenyl)-acetonitrile) and combination thereof.

As an example, the second P-type dopant 694 having the radialene structure may be selected from, but is not limited to, the following organic compound of Formula 10:

Formula 10

5-1

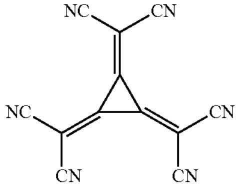

-continued 5-2

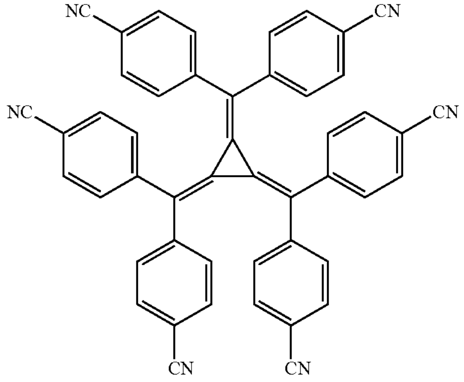

5-3

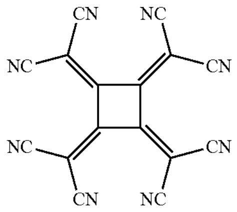

5-4

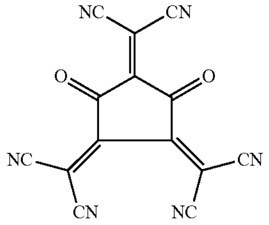

5-5

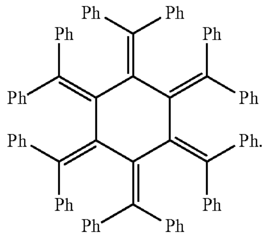

In one aspect, the contents of the second P-type dopant 694 in the P-CGL2 690 may be between about 3 wt % and about 30 wt %, for example, about 5 wt % and about 20 wt %.

When the contents of the second P-type dopant 694 in the P-CGL2 690 is less than about 3 wt %, the hole generation in the P-CGL2 690 as well as the hole transport and hole injection into the EML2 640 from the P-CGL2 690 may not be sufficient. In contrast, when the contents of the second P-type dopant 694 in the P-CGL2 690 is more than about 30 wt %, the P-CGL2 690 generates excessive holes, which causes the EML3 740 to decrease its luminous efficiency (roll-off) as the excessive holes are injected into the EML3 740 without recombining with electrons. For example, the contents of the second P-type dopant 694 in the P-CGL2 690 may be about 5 times to about 60 times, for example, about 5 times to about 20 times as the contents of the second N-type dopant 684 in the N-CGL2 680.

Each of the N-CGL1 580 and the N-CGL2 680 may be an organic layer including the first and second N-type hosts 582 and 682 and the first and second N-type dopants 584 and 684, respectively. For example, each of the first and second N-type hosts 582 and 682 may comprise independently, but is not limited to, an organic metal compound having a hydroxy-quinoline ligand such as $Alq_3$, a triazine-based compound, a benzazole-based compound, a xylol-based compound, Bphen and MTDATA.

Each of the first and second N-type dopants 584 and 684 may comprise independently an alkali metal such as Li, Na, K and Cs and/or an alkaline earth metal such as Mg, Sr, Ba and Ra. Alternatively, each of the first and second N-type dopants 584 and 684 may comprise independently, but is not limited to, an compound including an hpp (e.g., $Cr_2hpp_4$, $Fe_2hpp_4$, $Mnr_2hpp_4$, $Co_2hpp_4$, $Mo_2hpp_4$, $W_2hpp_4$, $Ni_2hpp_4$, $Cu_2hpp_4$, $Zn_2hpp_4$, $W(hpp)_4$) and/or an imidazole-based compound such as 4,4',5,5'-tetracyclohexyl-1,1',2,2',3,3'-hexamethyl-2,2',3,3'-tetrahydro-1H,1'H-2,2'-biimidazole, 2,2'-diisopropyl-1,1',3,3'-tetramethyl-2,2',3,3',4,4',5,5',6,6',7,7'-dodecahydro-1H,1'H-2,2'-bibenzo[d]imidazole, 2,2'-diisopropyl-4,4',5,5'-tetrakis(4-methoxyphenyl)-1,1',3,3'-tetramethyl-2,2',3,3'-tetrahydro-1H,1'H-2,2'-biimidazole, 2,2'-diisopropyl-4,5-bis(2-methoxyphenyl)-4',5'-bis(4-methoxyphenyl)-1,1',3,3'-tetramethyl-2,2',3,3'-tetrahydro-1H,1'H-2,2'-biimidazole, 2,2'-diisopropyl-4,5-bis(2-methoxyphenyl)-4',5'-bis(3-methoxyphenyl)-1,1',3,3'-tetramethyl-2,2',3,3'-tetrahydro-1H,1'H-2,2'-biimidazole.

In one aspect, the contents of the first and second N-type dopants 584 and 684 in the N-CGL1 580 and the N-CGL2 680 may be between about 0.1 wt % and about 5 wt %, for example, about 0.5 wt % and about 3 wt %, respectively. when the contents of the first and second N-type dopants 584 and 684 in the N-CGL1 580 and the N-CGL2 680 is less than about 0.1 wt %, the electron generation in the N-CGL1 580 and the N-CGL2 680 as well as the electron transport and electron injection into the first emitting part 500 and the second emitting part 600 from the N-CGL1 580 and the N-CGL2 680 may not be sufficient. In contrast, when the contents of the first and second N-type dopants 584 and 684 in the N-CGL1 580 and the N-CGL2 680 is more than about 5 wt %, excessive electrons are injected into the first emitting part 500 and the second emitting part 600 so that current leakage may be occurred or driving voltage of the OLED D3 may be raised.

Figure 9:
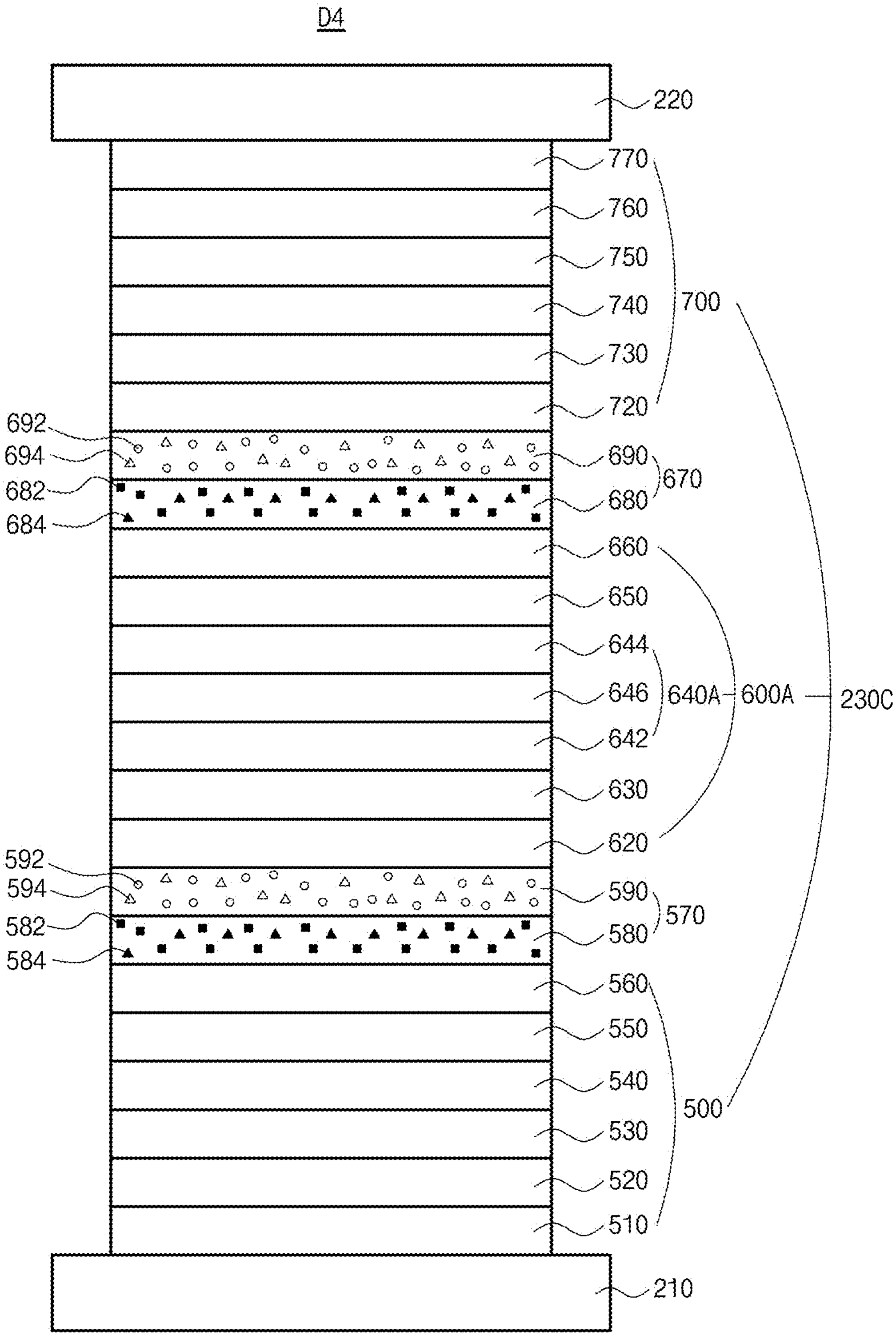
FIG. 9 is a cross-sectional view illustrating an organic light emitting diode having three emitting parts in accordance with still another aspect of the present disclosure.

Similar to the second aspect, the second emitting material layer in an OLED with three emitting parts may further comprise additional emitting material layer other than the red (R) and green (G) emitting material layers. FIG. 9 is a cross-sectional view illustrating an organic light emitting diode having three emitting parts in accordance with still another aspect of the present disclosure.

As illustrated in FIG. 9, an organic light emitting diode (OLED) D4 in accordance with this aspect includes first and second electrodes 210 and 220 facing each other and an emissive layer 230C disposed between the first and second electrodes 210 and 220. The emissive layer 230C includes a first emitting part 500 disposed between the first and second electrodes 210 and 220, a second emitting part 600A disposed between the first emitting part 500 and the second electrode 220, a third emitting part 700 disposed between the second emitting part 600A and the second electrode, a first charge generation layer (CGL1) 570 disposed between the first and second emitting parts 500 and 600A, and a second charge general layer (CGL2) 670 between the second and third emitting parts 600A and 700.

The first emitting part 500 includes the EML1 540. The first emitting part 500 may further include at least one of the HIL 510 and the HTL1 520 disposed sequentially between the first electrode and the EML1 540 and the ETL1 560 disposed between the EML1 540 and the CGL1 570. Alternatively, the first emitting part 500 may further comprise at least one of the EBL1 530 disposed between the HTL1 520 and the EML1 540 and the HBL1 550 disposed between the EML1 540 and the ETL1 560.

The second emitting part 600A includes the EML2 640A. The second emitting part 600A may further include at least one of the HTL2 620 disposed between the CGL1 570 and the EML2 640A and the ETL2 660 disposed between the EML2 640A and the CGL2 670. Alternatively, the second emitting part 600A may further comprise at least one of the EBL2 630 disposed between the HTL2 620 and the EML2 640A and the HBL2 650 disposed between the EML2 640A and the ETL2 660.

The third emitting part 700 includes the EML3 740. The third emitting part 700 may further includes at least one of the HTL3 720 disposed between the CGL2 670 and the EML3 740 and the ETL3 760 and the EIL 770 disposed sequentially between the EML3 740 and the second electrode 220. Alternatively, the third emitting part 700 may further comprise the EBL3 730 disposed between the HTL3 720 and the EML3 740 and/or the HBL3 750 disposed between the EML3 740 and the ETL3 760. The configurations other than the EML2 640A in the emissive layer 230C may be substantially identical to those in the emissive layer 230B as described above.

For example, each of the EML1 540 and the EML3 740 may be a blue (B) emitting material layer, respectively and may comprise blue (B) host and blue (B) dopant. The EML2 640A include a red (R) emitting material layer 642, a yellow green (YG) or yellow (Y) emitting material layer 646 and a green emitting material layer 644 each of which is disposed sequentially between the EBL2 630 and the HBL2 650. The red (R) emitting material layer 642 includes red (R) host and red (R) dopant, the green (G) emitting material layer 644 includes green host and green dopant. Each of the blue (B)/red (R)/green (G) host and the blue (B)/red (R)/green (G) dopant may be identical to that described above, respectively.

The yellow green (YG) or yellow (Y) emitting material layer 646 may include yellow green (YG) or yellow (Y) host and yellow green (YG) or yellow (Y) dopant. The yellow green (YG) or yellow (Y) host may comprise, but is not limited to, BCzPh, CBP, TCP, TCTA, CDBP, DMFL-CBP, Spiro-CBP, DPEPO, PCzB-2CN, mCzB-2CN, TCz1, $Bebq_2$, TPB3, BAlq and combination thereof, The yellow green (YG) or yellow (Y) dopant may comprise at least one of yellow green (YG) or yellow (Y) phosphorescent material, yellow green (YG) or yellow (Y) fluorescent material and yellow green (YG) or yellow (Y) delayed fluorescent material. For example, the yellow green (YG) or yellow (Y) dopant may comprise, but is not limited to, Rubrene, TBRb, $Ir(BT)_2(acac)$, $Ir(fbi)_2(acac)$, fac-$Ir(ppy)_2Pc$, FPQIrpic and combination thereof.

In this aspect, the HOMO energy level $HOMO^H$ of the first P-type host 592 and the LUMO energy level LUMOD of the first P-type dopant 594 in the P-CGL1 590 may satisfy the relationship of Formula A (see, FIG. 5). For example, the first P-type host 592 may comprise, but is not limited to, the anthracene-based compound having the Formulae 1 and 2 and/or the spirofluorene-based compound having the Formulae 3 and 4. Also, the first P-type dopant 594 may comprise, but is not limited to, the organic compound with at least one exocyclic double bond to the indacene core having the structure of Formulae 5 to 6.

The P-CGL1 has controlled energy bandgap ΔE1 between the HOMO energy level $HOMO^H$ of the first P-type host 592 and the LUMO energy level $LUMO^D$ of the first P-type dopant 594 so that the contents of the green light of the light emitted from the EML2 640A can be maintained irrespective of the gradation and current density. Therefore, the white light emitting from the OLED D4 has constant value, e.g., the chromaticity of Y-axis larger than the chromaticity of X-axis in the CIE chromaticity distribution irrespective of the gradation. In other words, since white light having a constant chromaticity without chromaticity inversion by gradation or current density is emitted from the OLED D4, efficient optical compensation can be performed.

In addition, the energy bandgap ΔE1 between the HOMO energy level $HOMO^H$ of the first P-type host 592 and the LUMO energy level $LUMO^D$ of the first P-type dopant 594 in the P-CGL1 590 (see, FIG. 5) is different form the energy bandgap ΔE2 between the HOMO energy level HOMO' of the second P-type host 692 and the LUMO energy level $LUMO^{D2}$ of the second P-type dopant 694 in the P-CGL2 690 (see, FIG. 8). The energy bandgap ΔE1 between the HOMO energy level $HOMO^H$ of the first P-type host 592 and the LUMO energy level $LUMO^D$ of the first P-type dopant 594 in the P-CGL1 590 may be larger than the energy bandgap ΔE2 between the HOMO energy level HOMO' of the second P-type host 692 and the LUMO energy level $LUMO^{D2}$ of the second P-type dopant 694 in the P-CGL2 690. For example, the energy bandgap ΔE2 between the HOMO energy level $HOMO^{H2}$ of the second P-type host 692 and the LUMO energy level $LUMO^{D2}$ of the second P-type dopant 694 in the P-CGL2 690 may satisfy the relationship of Formula B. Accordingly, the second P-type dopant 694 accepts electrons from the HOMO energy level of the second P-type host 692 or the hole transport material in the HTL3 720 to its LUMO energy level so that hole transport path for transporting holes from the P-CGL2 690 to the EML3 740 can be formed.

As an example, the second P-type host 692 may comprise the spirofluorene-based compound having the structure of Formulae 8 to 9. The second P-type dopant 694 may have a radialene structure or comprise an aromatic compound and a hetero aromatic compound each of which is substituted with at least one strong electron-withdrawing group such as a cyano group, a halogen atom (e.g., F, Cl and/or Br), a $C_1$-$C_{10}$ halo alkyl group such as $CF_3$ and/or a nitro group.

For example, the second P-type dopant 694 may comprise, but is not limited to, HAT-CN, F4-TCNQ, F6-TCNQ, CN6-CP, F6-TCNNQ, 2,2'-(2,5-dibromo-3,6-difluorocyclohexa-2,5-diene-1,4-diylidene)dimalonitrile, (2E,2'E,2"E)-2,2',2"-(cyclopropane-1,2,3-triylidene)tris(2-(perfluorophenyl)-acetonitrile), (2E,2'E,2"E)-2,2',2"-(cyclopropane-1,2,3-triylidene)tris(2-(perfluoropyridin-4-yl)-acetonitrile), (2E,2'E,2"E)-2,2',2"-(cyclopropane-1,2,3-triylidene)tris(2-(4-cyanoperfluorophenyl)-acetonitrile), (2E,2'E,2"E)-2,2',2"-(cyclopropane-1,2,3-triylidene)tris(2-(2,3,5,6-tetrafluoro-4-(trifluoromethyl)phenyl)-acetonitrile), (2E,2'E,2"E)-2,2',2"-(cyclopropane-1,2,3-triylidene)tris(2-(2,6-dichloro-3,5-difluoro-4-(trifluoromethyl)phenyl)-acetonitrile) and combination thereof.

In the above aspect, the OLEDs having three emitting parts and two charge generation layers between the emitting parts are described. Alternatively, the OLED may have quadruple or more tandem structures including one or more emitting part between the third emitting part and the second electrode and one or more charge generation layer over the third emitting part.

Figure 10:
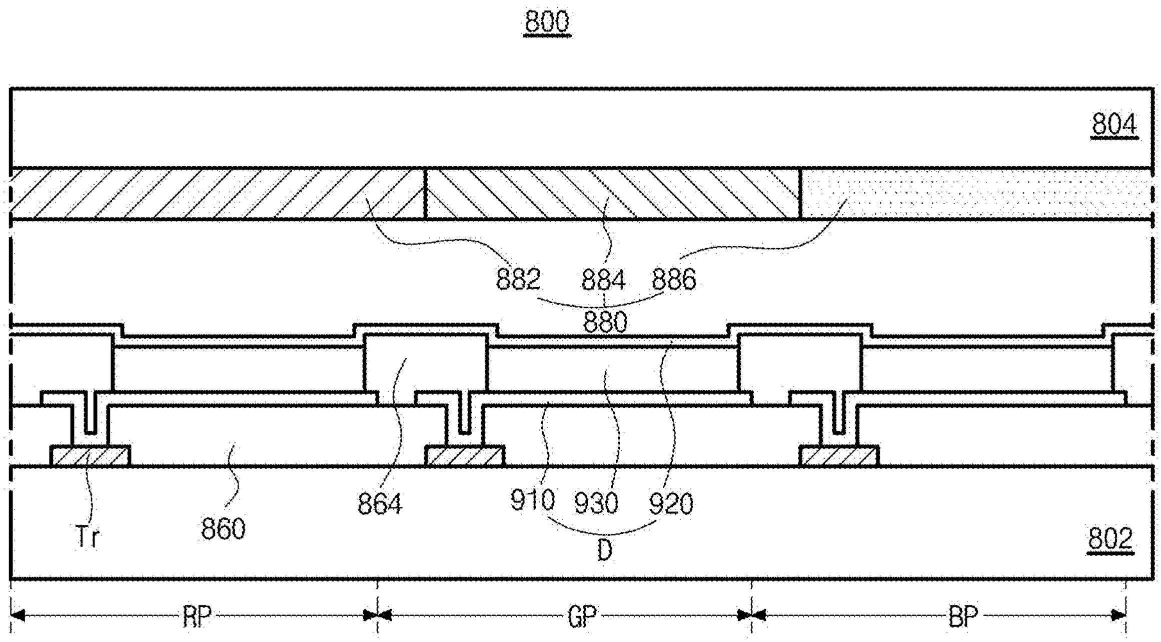
FIG. 10 is a cross-sectional view illustrating an organic light emitting display device in accordance with another aspect of the present disclosure.

In another aspect, an organic light emitting display device may further comprise a color conversion layer. FIG. 10 is a cross-sectional view illustrating an organic light emitting display device in accordance with another aspect of the present disclosure.

As illustrated in FIG. 10, the organic light emitting display device 800 comprises a first substrate 802 that defines each of a red pixel region RP, a green pixel region GP and a blue pixel region BP, a second substrate 804 facing the first substrate 802, a thin film transistor Tr over the first substrate 802, an organic light emitting diode (OLED) D disposed between the first and second substrates 802 and 804 and emitting white (W) light and a color conversion layer 880 disposed between the OLED D and the second substrate 804. Although not shown in FIG. 10, a color filter layer may be disposed between the second substrate 804 and the respective color conversion layer 880.

The thin film transistor Tr is disposed over the first substrate 802 correspondingly to each of the red pixel region RP, the green pixel region GP and the blue pixel region BP. A passivation layer 860, which has a drain contact hole exposing one electrode, for example a drain electrode, constituting the thin film transistor Tr, is formed with covering the thin film transistor Tr over the whole first substrate 802.

The OLED D, which includes a first electrode 910, an emissive layer 930 and a second electrode 920, is disposed over the passivation layer 860. The first electrode 910 may be connected to the drain electrode of the thin film transistor Tr through the drain contact hole. In addition, a bank layer 864 covering edges of the first electrode 910 is formed at the boundary between the red pixel region RP, the green pixel region GP and the blue pixel region BP. In this case, the OLED D may have a structure of FIGS. 3, 5, 6 and 8 and can emit white (W) light. The OLED D is disposed in each of the red pixel region RP, the green pixel region GP and the blue pixel region BP to provide white (W) light.

The color conversion layer 880 may include a first color conversion layer 882 corresponding to the red pixel region RP, a second color conversion layer 884 corresponding to the green pixel region GP and a third color conversion layer 886 corresponding to the blue pixel region BP. As an example, the color conversion layer 880 may include an inorganic luminescent material such as quantum dot (QD).

The white (W) light emitted from the OLED D in the red pixel region RP is converted into red (R) color light by the first color conversion layer 882, the white (W) light emitted from the OLED D in the green pixel region GP is converted into green (G) color light by the second color conversion layer 884 and the white (W) light emitted from the OLED D in the blue pixel region BP is converted into blue (B) color light by the third color conversion layer 886. Accordingly, the organic light emitting display device 800 can implement a full-color image.

In addition, when the light emitted from the OLED D is displayed through the first substrate 802, the color conversion layer 880 may be disposed between the OLED D and the first substrate 802.

Example 1 (Ex. 1)

Fabrication of OLED

An organic light emitting diode in which a P-CGL1 includes Compound 2-1 (N-9,9-Dimethyl-9H-fluoren-2-yl)-N-phenyl-9,9'H-spirobifluoren-3-amine, HOMO: −5.26 eV) as a first P-type host and Compound 3-1 in Formula 7 (LUMO: −4.85 eV) as a first P-type dopant and a P-CGL2 includes Compound 4-1 in Formula 9 (2,7-Bis(carbazol-9- yl)-9,9-spirobifluorene (Spiro-2CBP), HOMO: −5.16 eV) as a second P-type host and Compound 5-1 in Formula 10 (CN6-P, LUMO: −5.07 eV), having triple stack structure to realize white light. A glass substrate (40 mm×40 mm×40 mm) onto which ITO was coated as a thin film was washed and ultrasonically cleaned by solvent such as isopropyl alcohol, acetone and distilled water for 5 minutes and dried at 100° C. oven. After cleaning the substrate, the substrate was treated with $O_2$ plasma under vacuum for 2 minutes and then transferred to a vacuum chamber for depositing emission layer. Subsequently, an emissive layer and a cathode were deposited by evaporation from a heating boat under about 5~7×10$^{-7}$ Torr as the following order with setting the deposition rate of 1 Å/s.

HIL (NPD (90 wt %), F4-TCNQ (10 wt %), 100 Å); HTL1 (NPD, 1000 Å), blue EML (2-ADN (97 wt %), 1,6-Bis(diphenylamine) pyrene (3 wt %), 200 Å), ETL1 (TmPyPB, 100 Å), N-CGL1 (Bphen (98 wt %), Li (2 wt %), 150 Å), P-CGL1 (Compound 2-1 (90 wt %), Compound 3-1 (10 wt %), 100 Å), HTL2 (NPD, 200 Å), red EML (CBP (90 wt %), $Ir(piq)_3$ (10 wt %), 200 Å), green EML (CBP (90 wt %), $Ir(ppy)_3$ (10 wt %), 200 Å), ETL2 ($Alq_3$, 100 Å), N-CGL2 (Bphen (98 wt %), Li (2 wt %), 150 Å), P-CGL2 (Spiro-2CBP (90 wt %), CB6-CP (10 wt %), 150 Å), HLT3 (NPD, 200 Å), blue EML (2-AND (97 wt %, 1,6-Bis (diphenylamine)pyrene (3 wt %), 200 Å), ETL3 ($Alq_3$, 100 Å), EIL (LiF, 10 Å), cathode (Al, 2000 Å).

And then, the device was encapsulated by glass. After deposition of emissive layer and the cathode, the OLED was transferred from the deposition chamber to a dry box for film formation, followed by encapsulation using UV-curable epoxy and moisture getter. The energy bandgap between the HOMO energy level of the first P-type host and the LUMO energy level of the first P-type dopant in the P-CGL1 is 0.41 eV while the energy bandgap between the HOMO energy level of the second P-type host and the LUMO energy level of the second P-type dopant in the P-CGL2 is 0.09 eV.

Comparative Example 1 (Ref. 1)

Fabrication of OLEDS

A white OLED was fabricated using the same procedure and the same material as Example 1, except that Spiro-2CBP (HOMO: −5.16 eV) as the first and second P-type hosts and CBP-CP (LUMO: −5.07 eV) as the first and second P-type dopants were used in the P-CGL1 and the P-CGL2. The energy bandgap between the HOMO energy level of the P-type host and the LUMO energy level of the P-type dopant in the P-CGL1 and the P-CGL2 is 0.09 eV.

Comparative Examples 2 (Ref. 2)

Fabrication of OLEDs

A white OLED was fabricated using the same procedure and the same material as Example 1, except that Spiro-2CBP (HOMO: −5.16 eV) as the first and second P-type hosts and Compound 3-1 (LUMO: −4.85 eV) as the first and second P-type dopants were used in the P-CGL1 and the P-CGL2. The energy bandgap between the HOMO energy level of the P-type host and the LUMO energy level of the P-type dopant in the P-CGL1 and the P-CGL2 is 0.31 eV.

Experimental Example

Measurement of Luminous Properties of OLEDs

Each of the OLEDs, having 9 mm$^2$ of emission area, fabricated in Example 1 and Comparative Examples 1 to 2 was connected to an external power source and then luminous properties for all the OLEDs were evaluated using a constant current source (KEITHLEY) and a photometer PR650 at room temperature. In particular, luminous efficiency of green light by current density, color coordinates of emitted white light by current density and current density by voltage were evaluated. FIGS. 11 to 15 illustrate the evaluation results.

Figure 11:
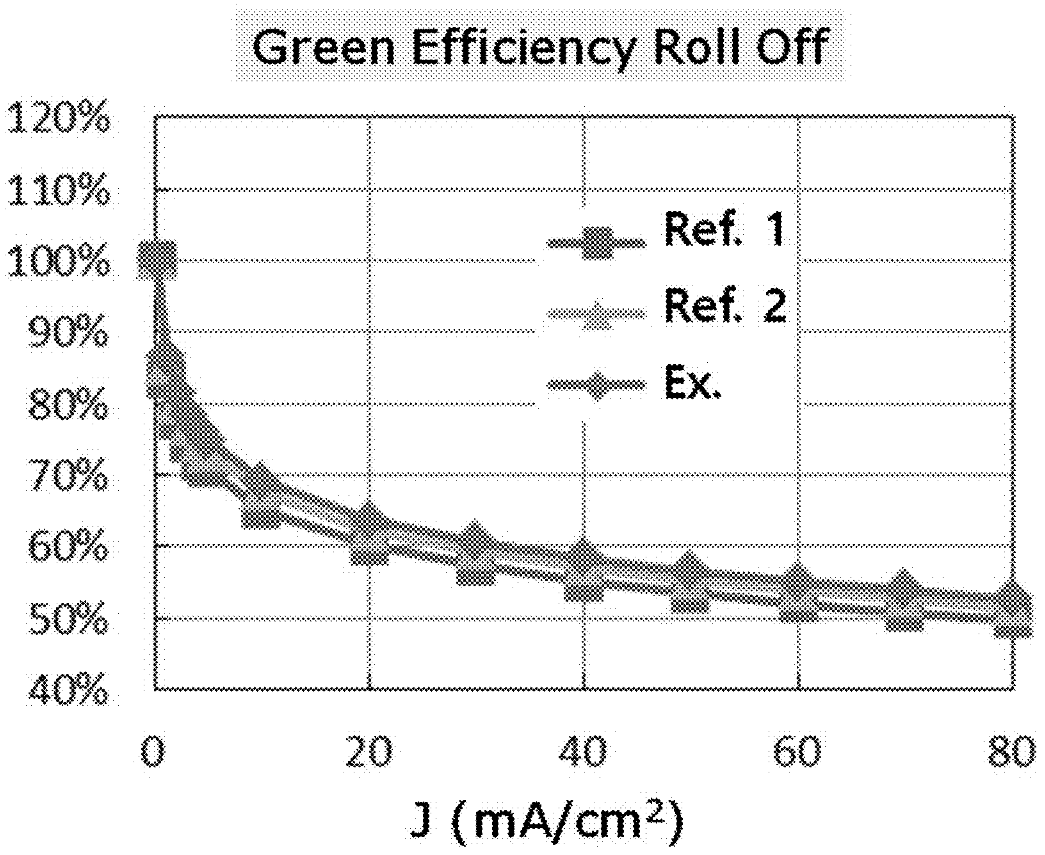
FIG. 11 is a graph illustrating luminous efficiency of green light by current density in OLEDs fabricated in References and Example.

As illustrated in FIG. 11, in the OLED fabricated in Ref. 1 and Ref. 2, severe roll-off occurred as the current density increased. On the other hand, it was confirmed that roll-off for the green light was reduced or minimized in the OLED fabricated in Example 1.

Figure 12:
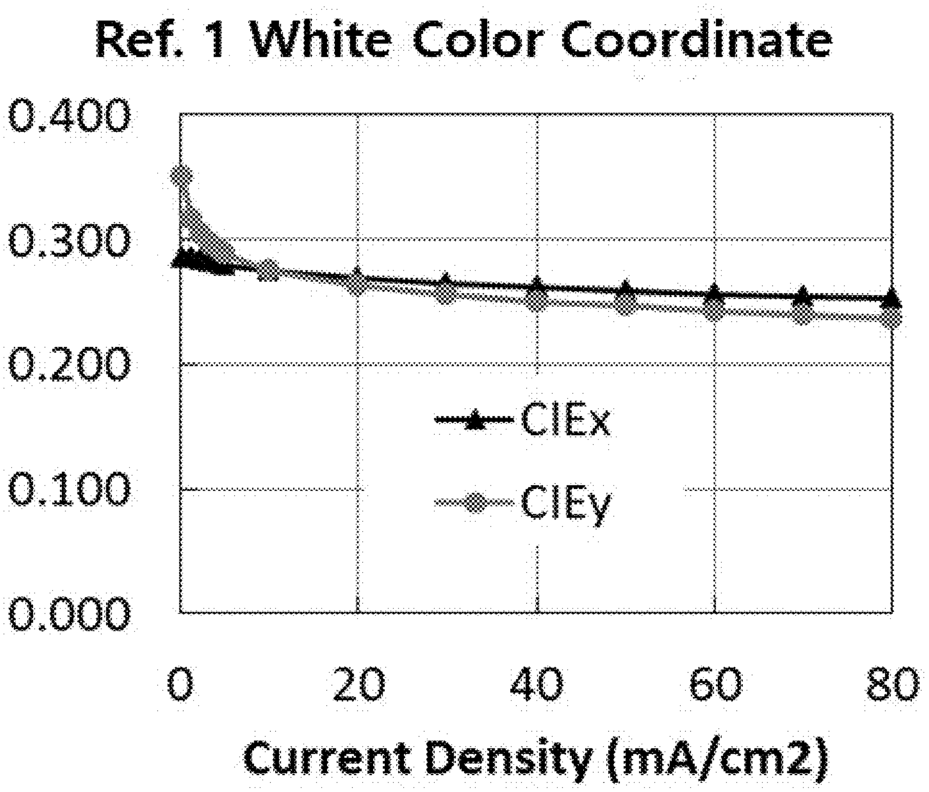
FIGS. 12 to 14 are graphs illustrating color coordinates of white light emitted from OLEDs fabricated in References and Example.
Figure 13:
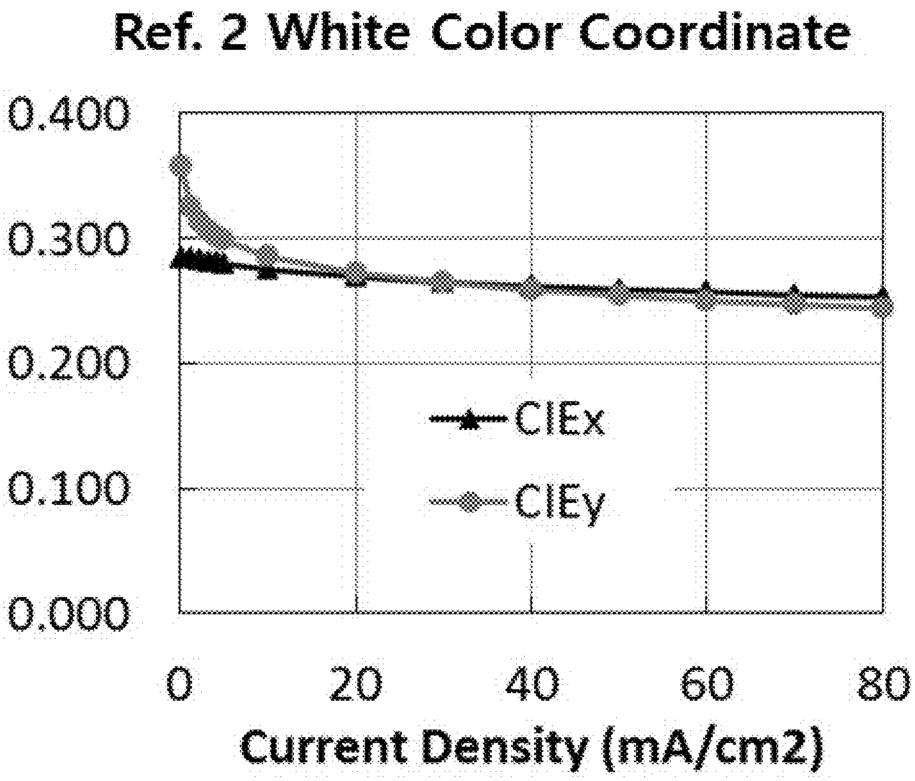

As illustrated in FIGS. 12 and 13, in the case of the OLED fabricated in Ref. 1 and Ref 2, while the white light emitted in the low-current density section contains relatively large amount of green color (CIEy>CIEx), the white light emitting in the high-current density section contains relatively large amount of red color (CIEx>CIEy). As color conversion occurs depending upon the current density, color compensation cannot be property implemented.

Figure 14:
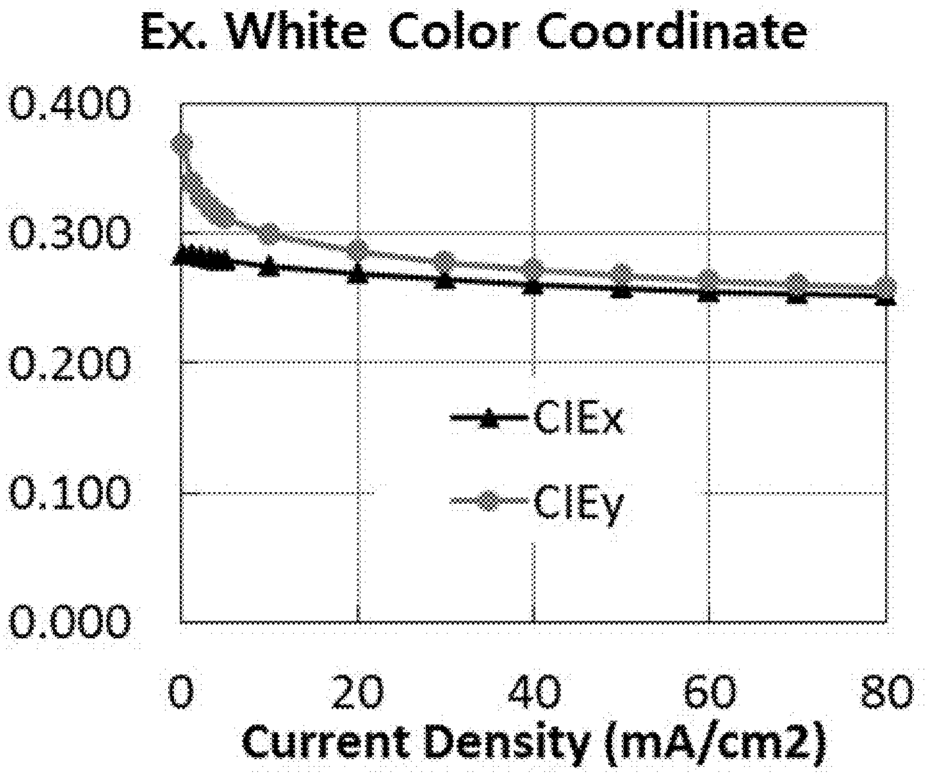
Figure 15:
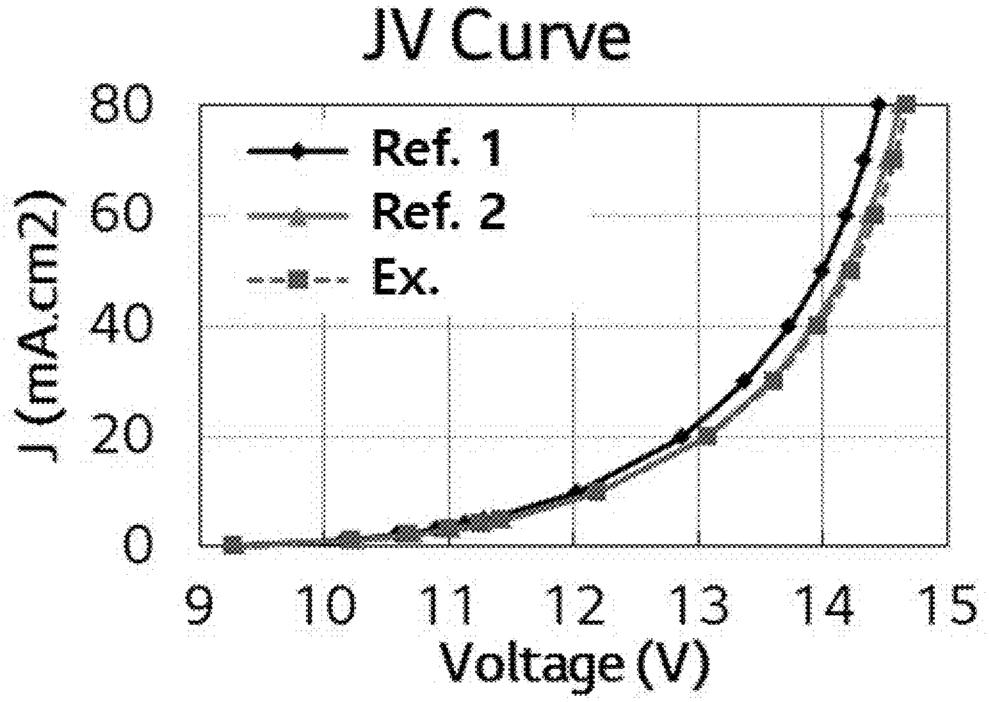
FIG. 15 is a graph illustrating current density measured by voltage changes in OLEDs fabricated in References and Example.

On the other hand, as illustrated in FIG. 14, in the OLED fabricated in Example, the contents of green light is uniformly higher than the contents of red light of emitted white light regardless of the current density (CIEy>CIEx). Therefore, white-balance can be efficiently implemented by compensating for red light component corresponding to the X-axis in the CIE chromaticity distribution with respect to the light emitted from the OLED, regardless of the current density.

It will be apparent to those skilled in the art that various modifications and variations can be made in the present disclosure without departing from the scope of the disclosure. Thus, it is intended that the present disclosure cover the modifications and variations of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting diode, comprising:

a first electrode;

a second electrode facing the first electrode;

multiple emitting parts between the first and second electrode; and at least one charge generation layer disposed between the multiple emitting parts, wherein the multiple emitting parts include at least one emitting part including a green emitting material layer, wherein the at least one charge generation layer includes a P-type charge generation layer providing holes into the green emitting material layer, wherein the P-type charge generation layer includes a P-type host and a P-type dopant, wherein an energy bandgap between a Highest Occupied Molecular Orbital (HOMO) energy level of the P-type host and a Lowest Unoccupied Molecular Orbital (LUMO) energy level of the P-type dopant satisfies a relationship of the following Formula A:

$$\text{about } 0.35\text{ eV} \leq \text{LUMO}^D - \text{HOMO}^H \leq \text{about } 0.5\text{ eV}; \qquad \text{Formula A:}$$

wherein $\text{LUMO}^D$ indicates the LUMO energy level of the P-type dopant and $\text{HOMO}^H$ indicates the HOMO energy level of the P-type host, wherein the P-type host has the HOMO energy level between about −5.0 eV and about −6.0 eV, and wherein the P-type dopant has the LUMO energy level between about −4.0 eV and about 5.0 eV, wherein the P-type host includes an organic compound having a structure of the following Formula 1 or Formula 3:

Formula 1

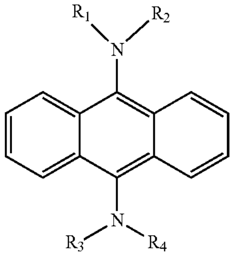

wherein each of $R_1$ to $R_4$ is independently an unsubstituted or substituted $C_6$-$C_{30}$ aryl group or an unsubstituted or substituted $C_3$-$C_{30}$ hetero aryl group;

Formula 3

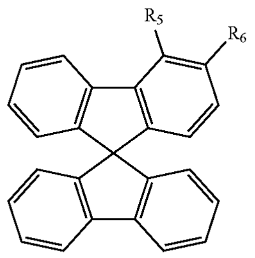

wherein each of $R_5$ and $R_6$ is independently protium, deuterium, an unsubstituted or substituted carbazolyl group or

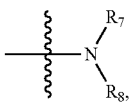

wherein at least one of $R_5$ and $R_6$ is an unsubstituted or substituted carbazolyl group or

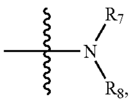

and wherein each of $R_7$ and $R_8$ is independently an unsubstituted or substituted $C_6$-$C_{30}$ aryl group or an unsubstituted or substituted $C_3$-$C_{30}$ hetero aryl group, wherein the P-type dopant includes an organic compound having a radialene core, a quinone core, or an indacene core, wherein the multiple emitting parts include a first emitting part disposed between the first and second electrode, a second emitting part disposed between the first emitting part and the second electrode and a third emitting part disposed between the second emitting part and the second electrode, wherein the at least one charge generation layer includes a first charge generation laver, and a second charge generation layer disposed between the second emitting part and the third emitting part, wherein the first charge generation layer includes the P-type charge generation layer and an N-type charge generation layer disposed adjacently to the P-type charge generation layer, wherein the second emitting part includes the green emitting material layer, wherein the P-type charge generation layer is disposed between the first and second emitting parts and the N-type charge generation layer is disposed between the first emitting part and the P-type charge generation laver, wherein the second charge generation layer includes a second P-type charge generation layer disposed between the second and third emitting parts and providing holes to the third emitting parts, and wherein the second P-type change generation layer includes a second P-type host and a second P-type dopant.

2. The organic light emitting diode of claim 1, wherein the at least one charge generation layer further comprises an N-type charge generation layer disposed adjacently to the P-type charge generation layer, and wherein the N-type charge generation layer provides electrons to an emitting part other than the emitting part including the green emitting material layer.

3. The organic light emitting diode of claim 1, wherein the at least one emitting part further comprises a red emitting material layer disposed between the P-type charge generation layer and the second electrode.

4. The organic light emitting diode of claim 3, wherein the green emitting material layer is disposed between the red emitting material layer and the second electrode.

5. The organic light emitting diode of claim 4, wherein the at least one emitting part further comprises either a yellow-green or a yellow emitting material layer disposed between the red emitting material layer and the green emitting material layer.

6. The organic light emitting diode of claim 1, wherein the first emitting part includes a blue emitting material layer.

7. The organic light emitting diode of claim 1, wherein the third emitting part includes a blue emitting material layer.

8. The organic light emitting diode of claim 1, wherein an energy bandgap between the HOMO energy level of the P-type host and the LUMO energy level of the P-type dopant in the first charge generation layer is different form an energy bandgap between a HOMO energy level of the second P-type host and a LUMO energy level of the second P-type dopant in the second charge generation layer.

9. The organic light emitting diode of claim 8, wherein the energy bandgap between the HOMO energy level of the second P-type host and the LUMO energy level of the second P-type dopant satisfies a relationship of the following Formula B:

$$\text{about } 0.35\text{ eV} \leq LUMO^{D2} - HOMO^{H2} \leq \text{about } 0.5\text{ eV} \quad \text{Formula B:}$$

wherein $LUMO^{D2}$ indicates the LUMO energy level of the second P-type dopant and $HOMO^{H2}$ indicates the HOMO energy level of the second P-type host.

10. An organic light emitting device, comprising:

a substrate; and an organic light emitting diode of claim 1 over the substrate.

11. The organic light emitting device of claim 10, wherein the organic light emitting device further comprise at least one of a thin film transistor over the substrate and connected to the organic light emitting diode and a color filter layer disposed between the substrate and the organic light emitting diode or over the organic light emitting diode.

12. The organic light emitting diode of claim 1, wherein the P-type dopant includes an organic compound having the following structure of Formula 5:

Formula 5

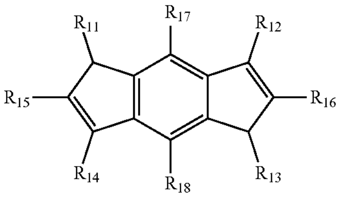

wherein $R_{11}$ is a group of an exocyclic double bond having the following structure of Formula 6; one of $R_{12}$ and $R_{13}$ is identical to $R_{11}$ and the other of $R_{12}$ and $R_{13}$ is identical to $R_{14}$; each of $R_{14}$ to $R_{16}$ is independently a halogen atom, a $C_1$-$C_{10}$ alkyl group substituted with at least one halogen atom, a $C_1$-$C_{10}$ alkoxy group substituted with at least one halogen atom, a $C_1$-$C_{10}$ alkyl silyl group substituted with at least one halogen atom, a cyano group, a nitro group, a $C_6$-$C_{30}$ aryl group or a $C_3$-$C_{30}$ hetero aryl group, wherein each of the aryl group and the hetero aryl group may be independently substituted with at least one of a halogen atom, a $C_1$-$C_{10}$ alkyl group substituted with at least one of halogen atom, a $C_1$-$C_{10}$ alkoxy group substituted with at least one halogen atom, a $C_1$-$C_{10}$ alkyl silyl group substituted with at least one halogen atom, a cyano group and a nitro group; each of $R_{17}$ and $R_{18}$ is independently protium, deuterium, a $C_1$-$C_{10}$ alkyl group or a $C_1$-$C_{10}$ alkoxy group, Formula 6

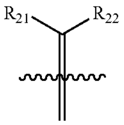

wherein each of $R_{21}$ and $R_{22}$ is independently a halogen atom, a $C_1$-$C_{10}$ alkyl group substituted with at least one halogen atom, a $C_1$-$C_{10}$ alkoxy group substituted with at least one halogen atom, a $C_1$-$C_{10}$ alkyl silyl group substituted with at least one halogen atom, a cyano group, a nitro group, a $C_6$-$C_{30}$ aryl group or a $C_3$-$C_{30}$ hetero aryl group, wherein each of the aryl group and the hetero aryl group may be independently substituted with at least one of a halogen atom, a $C_1$-$C_{10}$ alkyl group substituted with at least one of halogen atom, a $C_1$-$C_{10}$ alkoxy group substituted with at least one halogen atom, a $C_1$-$C_{10}$ alkyl silyl group substituted with at least one halogen atom, a cyano group and a nitro group.

13. The organic light emitting diode of claim 1, wherein the P-type host is selected from:

1-1

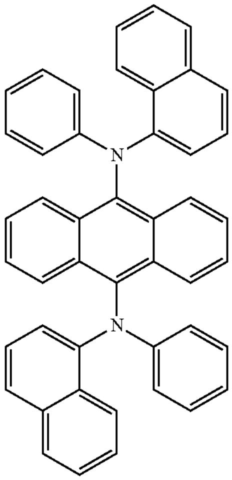

1-2

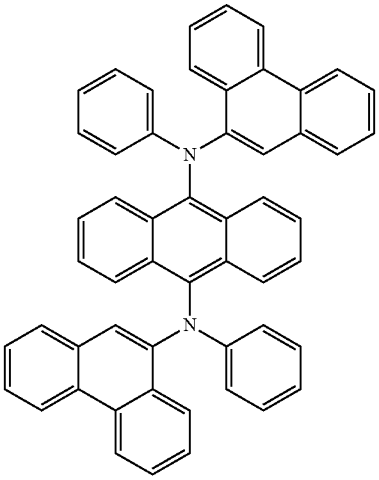

-continued
1-3
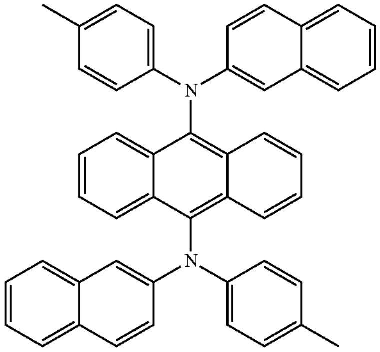
1-4
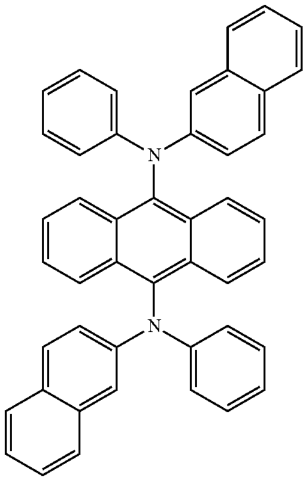
2-1
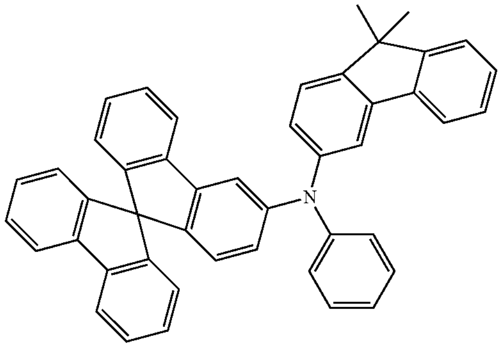
-continued
2-2
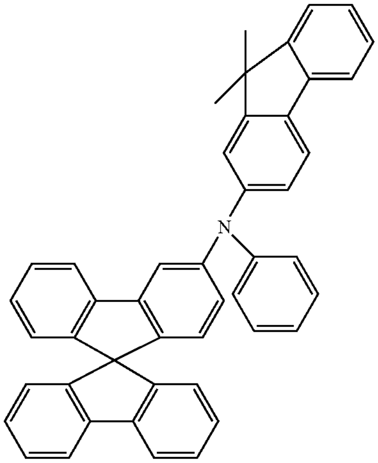
2-3
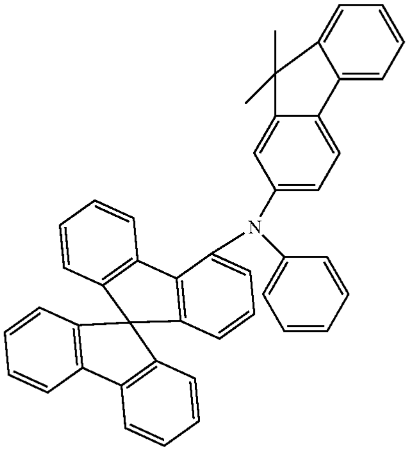
2-4
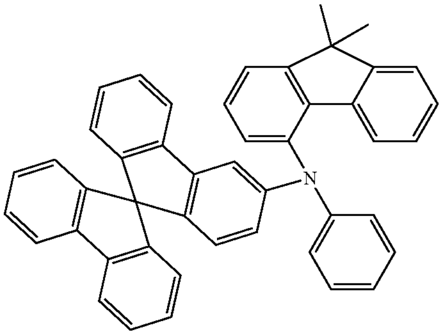

-continued
2-5
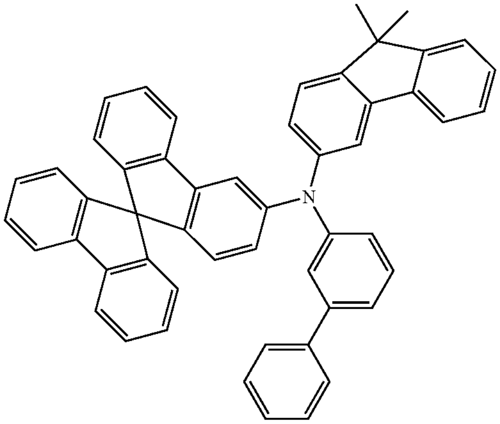
2-6
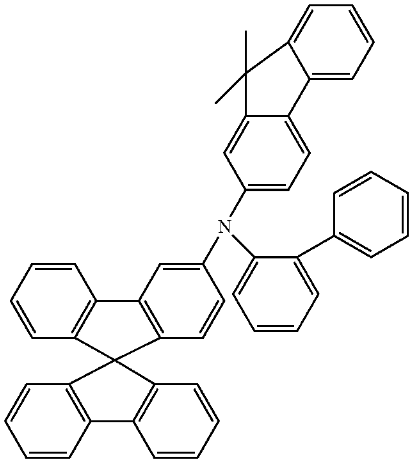
2-7
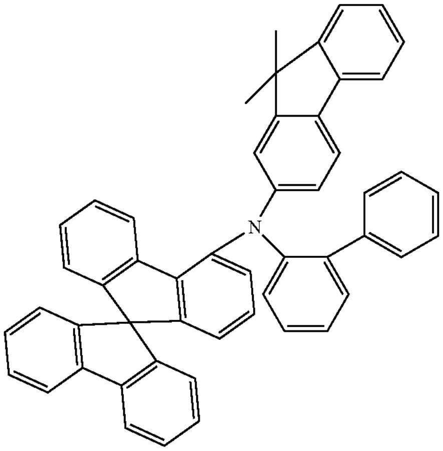
-continued
2-8
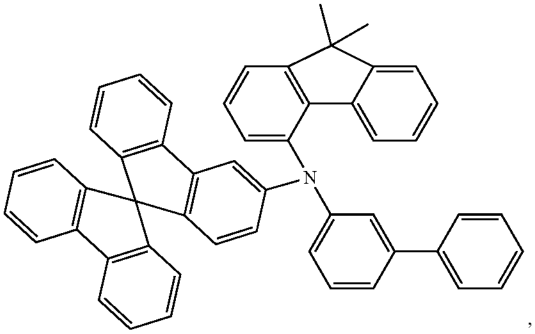
,
and
wherein the P-type dopant is selected from:
3-1
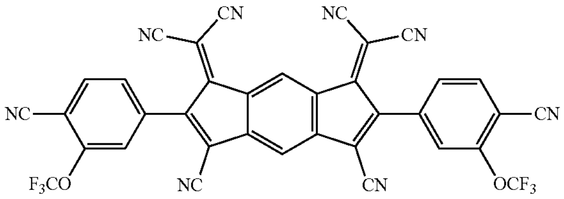
3-2
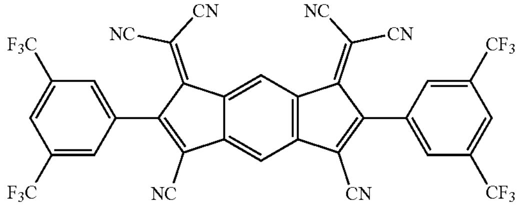
3-3
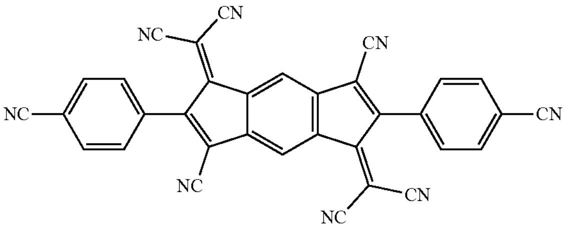
3-4
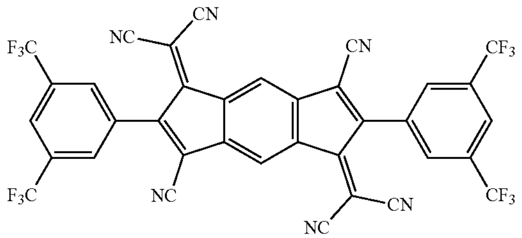

-continued 3-5

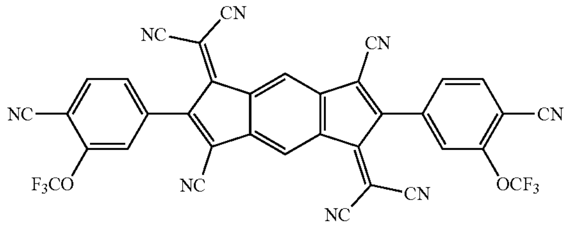

3-6

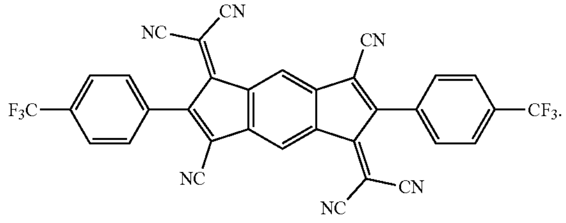

14. An organic light emitting diode comprising:

a first electrode;

a second electrode facing the first electrode; and an emissive layer disposed between the first and second electrodes, wherein the emissive layer includes:

a first emitting part disposed between the first and second electrodes, a second emitting part disposed between the first emitting part and the second electrode, a third emitting part disposed between the second emitting part and the second electrode, a first charge generation layer disposed between the first and second emitting parts, and a second charge generation layer disposed between the second and third emitting parts, wherein the second emitting part includes a green emitting material layer and a red emitting material layer, wherein the first charge generation layer includes a first P-type charge generation layer providing holes to the second emitting part and a first N-type charge generation layer providing electrons to the first emitting part, wherein the second charge generation layer includes a second P-type charge generation layer providing holes to the third emitting part and a second N-type charge generation layer providing electrons to the second emitting part, wherein the first P-type charge generation layer includes a first P-type host and a first P-type dopant, wherein the second P-type charge generation layer includes a second P-type host and a second P-type dopant, wherein an energy bandgap between a Highest Occupied Molecular Orbital (HOMO) energy level of the first P-type host and a Lowest Unoccupied Molecular Orbital (LUMO) energy level of the first P-type dopant is different form an energy bandgap between a HOMO energy level of the second P-type host and a LUMO energy level of the second P-type dopant, wherein the first P-type host has the HOMO energy level between about −5.0 eV and about −6.0 eV, wherein the first P-type dopant has the LUMO energy level between about −4.0 eV and about 5.0 eV, wherein the second P-type host has the HOMO energy level between about −5.0 eV and about −6.0 eV, and wherein the second P-type dopant has the LUMO energy level between about −5.0 eV and about −5.5 eV, wherein the first P-type host includes an organic compound having a structure of the following Formula 1 or Formula 3:

Formula 1

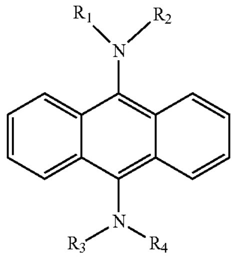

wherein each of $R_1$ to $R_4$ is independently an unsubstituted or substituted $C_6$-$C_{30}$ aryl group or an unsubstituted or substituted $C_3$-$C_{30}$ hetero aryl group;

Formula 3

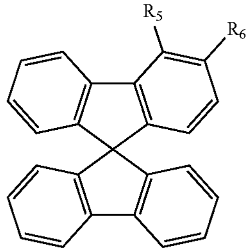

wherein each of $R_5$ and $R_6$ is independently protium, deuterium, an unsubstituted or substituted carbazolyl group or

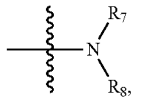

wherein at least one of $R_5$ and $R_6$ is an unsubstituted or substituted carbazolyl group or

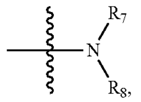

and wherein each of $R_7$ and $R_8$ is independently an unsubstituted or substituted $C_6$-$C_{30}$ aryl group or an unsubstituted or substituted $C_3$-$C_{30}$ hetero aryl group, wherein the first P-type dopant includes an organic compound having a radialene core, a quinone core, or an indacene core, wherein the second P-type host includes a spirofluorene-based compound having the following structure of Formula 8:

Formula 8

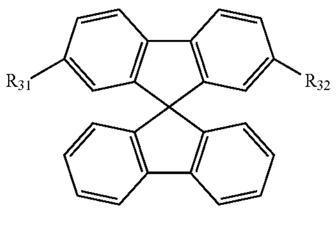

wherein each of $R_{31}$ and $R_{32}$ is independently protium, deuterium, a carbazolyl group or

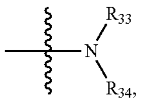

wherein at least one of $R_{31}$ and $R_{32}$ is a carbazolyl group or

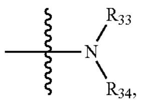

each of $R_{33}$ and $R_{34}$ is independently a $C_6$-$C_{30}$ aryl group or a $C_3$-$C_{30}$ hetero aryl group, and wherein each of the carbazolyl group, the aryl group and the hetero aryl group may be independently unsubstituted or substituted with at least one $C_1$-$C_{10}$ alkyl group, and at least one of $R_{33}$ and $R_{34}$ may be a poly-cyclic aryl group or a poly-cyclic hetero aryl group, and wherein the second P-type dopant includes an organic compound having a radialene structure or comprises an aromatic compound and a hetero aromatic compound each of which is substituted with at least one strong electron-withdrawing group, wherein the strong electron-withdrawing group includes a cyano group, a halogen atom, a $C_1$-$C_{10}$ halo alkyl group and a nitro group.

15. The organic light emitting diode of claim 14, wherein the energy bandgap between the HOMO energy level of the first P-type host and the LUMO energy level of the first P-type dopant satisfies a relationship of the following Formula A:

$$\text{about } 0.35\text{ eV} \leq \text{LUMO}^{D} - \text{HOMO}^{H} \leq \text{about } 0.5\text{ eV}; \qquad \text{Formula A:}$$

wherein $\text{LUMO}^{D}$ indicates the LUMO energy level of the first P-type dopant and $\text{HOMO}^{H}$ indicates the HOMO energy level of the first P-type host.

16. The organic light emitting diode of claim 14, wherein the energy bandgap between the HOMO energy level of the second P-type host and the LUMO energy level of the second P-type dopant satisfies a relationship of the following Formula B:

$$\text{about } 0.05\text{ eV} \leq \text{LUMO}^{D2} - \text{HOMO}^{H2} \leq \text{about } 0.2\text{ eV}; \qquad \text{Formula B:}$$

wherein $\text{LUMO}^{D2}$ indicates the LUMO energy level of the second P-type dopant and $\text{HOMO}^{H2}$ indicates the HOMO energy level of the second P-type host.

17. The organic light emitting diode of claim 14, wherein the green emitting material layer is disposed between the first and second charge generation layers and the red emitting material layer is disposed between the first charge generation layer and the green emitting material layer.

18. The organic light emitting diode of claim 17, wherein the second emitting part further comprise either a yellow-green or a yellow emitting material layer disposed between the red emitting material layer and the green emitting material layer.

19. The organic light emitting diode of claim 14, wherein at least one of the first emitting part and the third emitting part includes a blue emitting material layer.

20. The organic light emitting diode of claim 14, wherein contents of the first P-type dopant in the first P-type charge generation layer is between about 5 times and about 60 times as contents of the first N-type dopant in the first N-type charge generation layer.

21. An organic light emitting device, comprising:

a substrate; and an organic light emitting diode of claim 14 over the substrate.

22. The organic light emitting device of claim 21, wherein the organic light emitting device further comprises at least one of a thin film transistor over the substrate and connected to the organic light emitting diode and a color filter layer disposed either between the substrate and the organic light emitting diode or over the organic light emitting diode.

23. The organic light emitting diode of claim 14, wherein the first P-type dopant includes an organic compound having the following structure of Formula 5:

Formula 5

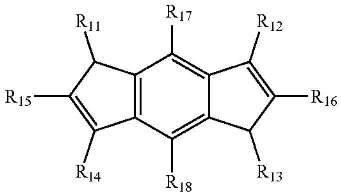

wherein $R_{11}$ is a group of an exocyclic double bond having the following structure of Formula 6; one of $R_{12}$ and $R_{13}$ is identical to $R_{11}$ and the other of $R_{12}$ and $R_{13}$ is identical to $R_{14}$; each of $R_{14}$ to $R_{16}$ is independently a halogen atom, a $C_1$-$C_{10}$ alkyl group substituted with at least one halogen atom, a $C_1$-$C_{10}$ alkoxy group substituted with at least one halogen atom, a $C_1$-$C_{10}$ alkyl silyl group substituted with at least one halogen atom, a cyano group, a nitro group, a $C_6$-$C_{30}$ aryl group or a $C_3$-$C_{30}$ hetero aryl group, wherein each of the aryl group and the hetero aryl group may be independently substituted with at least one of a halogen atom, a $C_1$-$C_{10}$ alkyl group substituted with at least one of halogen atom, a $C_1$-$C_{10}$ alkoxy group substituted with at least one halogen atom, a $C_1$-$C_{10}$ alkyl silyl group substituted with at least one halogen atom, a cyano group and a nitro group; each of $R_{17}$ and $R_{18}$ is independently protium, deuterium, a $C_1$-$C_{10}$ alkyl group or a $C_1$-$C_{10}$ alkoxy group, Formula 6

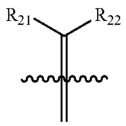

wherein each of $R_{21}$ and $R_{22}$ is independently a halogen atom, a $C_1$-$C_{10}$ alkyl group substituted with at least one halogen atom, a $C_1$-$C_{10}$ alkoxy group substituted with at least one halogen atom, a $C_1$-$C_{10}$ alkyl silyl group substituted with at least one halogen atom, a cyano group, a nitro group, a $C_6$-$C_{30}$ aryl group or a $C_3$-$C_{30}$ hetero aryl group, wherein each of the aryl group and the hetero aryl group may be independently substituted with at least one of a halogen atom, a $C_1$-$C_{10}$ alkyl group substituted with at least one of halogen atom, a $C_1$-$C_{10}$ alkoxy group substituted with at least one halogen atom, a $C_1$-$C_{10}$ alkyl silyl group substituted with at least one halogen atom, a cyano group and a nitro group.

24. The organic light emitting diode of claim 14, wherein the second P-type dopant is selected from 1,4,5,8,9,11-Hexaazatriphenylenehexacarbonitrile (HAT-CN), 2,3,5,6-tetrafluoro-7,7,8,8-tetracyanoquinodimethane (F4-TCNQ), 7,7,8,8-Tetracyanoquinodimethane (F6-TCNQ), hexacyano-trimethylene-cyclopropane (CN6-CP), 2,2-(perfluoronaphthalene-2,6-diylidene)-dimalononitrile (F6-TCNNQ), 2,2'-(2,5-dibromo-3,6-difluorocyclohexa-2,5-diene-1,4-diylidene) dimalonitrile, (2E,2'E,2"E)-2,2',2"-(cyclopropane-1,2,3-triylidene)tris(2-(perfluorophenyl)-acetonitrile), (2E,2'E,2"E)-2,2',2"-(cyclopropane-1,2,3-triylidene)tris(2-(perfluoropyridin-4-yl)-acetonitrile), (2E, 2'E,2"E)-2,2',2"-(cyclopropane-1,2,3-triylidene)tris(2-(4-cyanoperfluorophenyl)-acetonitrile), (2E,2'E,2"E)-2,2',2"-(cyclopropane-1,2,3-triylidene)tris(2-(2,3,5,6-tetrafluoro-4-(trifluoromethyl) phenyl)-acetonitrile), (2E,2'E,2"E)-2,2',2"-(cyclopropane-1,2,3-triylidene)tris(2-(2,6-dichloro-3,5-difluoro-4-(trifluoromethyl)phenyl)-acetonitrile), and any one of the following organic compounds:

5-1

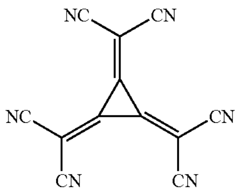

-continued 5-2

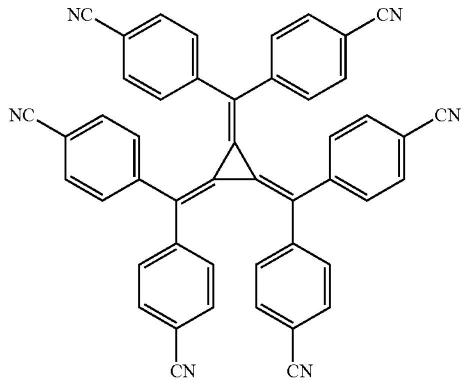

5-3

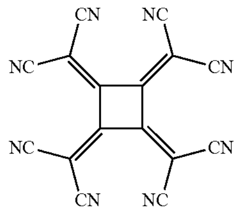

5-4

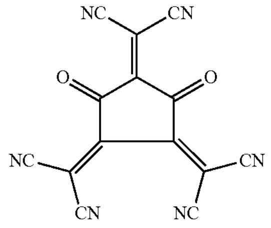

5-5

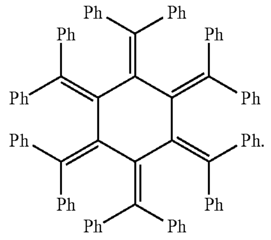

* * * * *